(12) United States Patent
Wang et al.

(10) Patent No.: US 11,462,682 B2
(45) Date of Patent: Oct. 4, 2022

(54) WORK FUNCTION STRUCTURE FOR VOLTAGE-CONTROLLED MAGNETIC ANISOTROPY

(71) Applicant: Regents of the University of Minnesota, Minneapolis, MN (US)

(72) Inventors: Jian-Ping Wang, Shoreview, MN (US); Thomas Jon Peterson, Lauderdale, MN (US); Anthony William Hurben, Bloomington, MN (US); Delin Zhang, Saint Paul, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 17/249,105

(22) Filed: Feb. 19, 2021

(65) Prior Publication Data

US 2022/0271218 A1    Aug. 25, 2022

(51) Int. Cl.

| | |
|---|---|
| *G11C 11/00* | (2006.01) |
| *H01L 43/10* | (2006.01) |
| *G11C 11/16* | (2006.01) |
| *G06N 3/04* | (2006.01) |
| *H01L 43/02* | (2006.01) |
| *H01L 43/12* | (2006.01) |
| *H01L 27/22* | (2006.01) |

(52) U.S. Cl.
CPC ............ *H01L 43/10* (2013.01); *G06N 3/049* (2013.01); *G11C 11/161* (2013.01); *G11C 11/1673* (2013.01); *G11C 11/1675* (2013.01); *H01L 27/222* (2013.01); *H01L 43/02* (2013.01); *H01L 43/12* (2013.01)

(58) Field of Classification Search
CPC ....... H01L 43/10; H01L 27/222; H01L 43/02; H01L 43/12; G11C 11/161; G11C 11/1673; G11C 11/1675; G06N 3/049
USPC .................................................. 365/158, 173
See application file for complete search history.

(56) References Cited

U.S. PATENT DOCUMENTS

| | | | | |
|---|---|---|---|---|
| 6,944,052 | B2 * | 9/2005 | Subramanian | G11C 11/16 257/E27.005 |
| 7,112,354 | B2 * | 9/2006 | Hannah | G11C 11/16 365/158 |
| 9,166,146 | B2 * | 10/2015 | Wang | G11C 11/22 |
| 9,530,822 | B2 * | 12/2016 | Shukh | H01L 27/224 |
| 10,283,561 | B2 | 5/2019 | Wang et al. | |
| 10,468,456 | B2 * | 11/2019 | Jacob | H01L 43/08 |

(Continued)

OTHER PUBLICATIONS

U.S. Appl. No. 16/861,869, filed Apr. 29, 2020, naming inventors Wang et al.

(Continued)

*Primary Examiner* — Viet Q Nguyen
(74) *Attorney, Agent, or Firm* — Shumaker & Sieffert, P.A.

(57) ABSTRACT

A magnetic device may include a layer stack including a work function structure, a dielectric layer, and a ferromagnetic layer, where the ferromagnetic layer is positioned between the work function structure and the dielectric layer. The work function structure is configured to deplete electrons from the ferromagnetic layer or accumulate electrons in the ferromagnetic layer. A magnetization orientation of the ferromagnetic layer is configured to be switched by a voltage applied across the layer stack or by a voltage applied across or through the work function structure.

20 Claims, 11 Drawing Sheets

(56) References Cited

U.S. PATENT DOCUMENTS

| | | | | |
|---|---|---|---|---|
| 10,840,431 | B2* | 11/2020 | Karpov | H01L 27/228 |
| 10,854,257 | B2 | 12/2020 | Wang et al. | |
| 11,062,752 | B2* | 7/2021 | Rahman | G11C 11/161 |
| 11,107,975 | B2* | 8/2021 | Lin | H01F 41/307 |
| 11,183,227 | B1* | 11/2021 | Wang | H01L 43/10 |
| 11,251,365 | B2* | 2/2022 | Gosavi | H01L 43/10 |
| 2013/0334632 | A1* | 12/2013 | Park | H01L 27/224 257/421 |
| 2017/0077392 | A1* | 3/2017 | Han | H03K 19/18 |
| 2020/0381614 | A1* | 12/2020 | Min | G11C 11/161 |
| 2021/0125651 | A1 | 4/2021 | Wang et al. | |

OTHER PUBLICATIONS

Zhang et al., "Elucidating the Voltage Controlled Magnetic Anisotropy," Materials Science, Physical Review B, vol. 96, No. 014435, 10.1103/PhysRevB.96.014435, accessed from https://arxiv.org/abs/1612.02724, submitted Dec. 8, 2016, 8 pp.

Khvalkovskiy et al., "Basic principles of STT-MRAM cell operation in memory arrays," Research Gate, Journal of Physics D Applied Physics, vol. 46, No. 7, 074001, DOI:10.1088/0022-3727/46/7/074001, Jan. 2013, 35 pp.

Miron et al., "Perpendicular switching of a single ferromagnetic layer induced by in-plane current injection," Research Gate, Macmillan Publishers Ltd., Nature, vol. 476, DOI: 10.1038/nature10309, Aug. 11, 2011, pp. 189-193.

Liu et al., "Spin torque switching with the giant spin Hall effect of tantalum," Research Gate, Science, vol. 336, No. 6081, DOI:10.1126/science.1218197, May 2012, pp. 555-558.

Nozaki et al., "Recent Progress in the Voltage-Controlled Magnetic Anistropy Effect and the Challenges Faced in Developing Voltage-Torque MRAM," MDPI, Micromachines, vol. 10, No. 327, doi:10.3390/mi10050327, May 15, 2019, 31 pp.

Duan et al., "Predicted Magnetoelectric Effect in Fe/BaTiO3 Multilayers: Ferroelectric Control of Magnetism," The American Physical Society, Physical Review Letters, vol. 97, DOI: 10.1103/PhysRevLett.97.047201, Jul. 28, 2006, pp. 047201-1-047201-4.

Weisheit et al., "Electric Field-Induced Modification of Magnetism in Thin-Film Ferromagnets," Science Mag, Science, vol. 315, DOI: 10.1126/science.1136629, Jan. 19, 2007, pp. 349-351.

Maruyama et al., "Large voltage-induced magnetic anisotropy change in a few atomic layers of iron," Nature Nanotechnology, vol. 4, Mar. 2009, pp. 158-161.

Niranjan et al., "Electric Field Effect on Magnetization and Magnetocrystalline Anisotropy at the Fe/MgO(001) Interface," Research Gate, Applied Physics Letters, vol. 96, No. 22, DOI:10.1063/1.3443658, Jun. 2010, 222504-222504-3.

Nozaki et al., "Large Voltage-Induced Changes in the Perpendicular Magnetic Anisotropy of an MgO-Based Tunnel with an Ultrathin Fe Layer," American Physical Society, Physical Review Applied, vol. 5, 044006, Apr. 15, 2016, 10 pp.

Amiri et al., "Electric-Field-Controlled Magnetoelectric RAM: Progress, Challenges, and Scaling," IEEE Transactions on Magnetics, vol. 51, No. 11, 10.1109/TMAG.2015.2443124, Nov. 2015, 7 pp.

Zhang et al., "Model of orbital populations for voltage-controlled magnetic anisotropy in transition-metal thin films," American Physical Society, Physical Review B, vol. 96, Jul. 28, 2017, p. 014435-1-014435-8.

Chu et al., "A Micromachined Kelvin Probe With Integrated Actuator for Microfluidic and Solid-State Applications," IEEE, Journal of Microelectricalmechanical Systems, vol. 14, No. 4, 10.1109/JMEMS.2005.845453, Aug. 2005, pp. 691-698.

Lu et al., "Characteristics and Mechanisms of Tunable Work Function Gate Electrodes Using a Bilayer Metal Structure an SiO2 and HfO2," IEEE Electron Device Letters, vol. 26, No. 7, 10.1109/LED.2005.851232, Jul. 2005, pp. 445-447.

Giovannetti et al., "Doping graphene with metal contacts," PubMed, Physical Review Letters, vol. 101, No. 2, DOI:10.1103/PhysRevLett.101.026803, Aug. 2008, 4 pp.

Lu et al., "Electron work function—a promising guiding parameter for material design," Scientific Reports, vol. 6, Article No. 24366, DOI: 10.1038/srep24366, Apr. 14, 2016, 11 pp.

Endo et al., "Electric-field effects on thickness dependent magnetic anisotropy of sputtered MgO/Co40Fe40B20/Ta structures," AIP, American Insittute of Physics, Applied Physics Letters, vol. 96, 212503, doi: 10.1063/1.3429592, May 27, 2010, 4 pp.

Li et al., "Enhancement of voltage-controlled magnet anisotropy through precise control of Mg insertion thickness at CoFeB|MgO interface," AIP Publishing, Applied Physics Letters, vol. 110, Article No. 052401, https://doi.org/10.1063/1.4975160, Jan. 30, 2017, 6 pp.

Lau et al., "Electric field modulation of the non-linear areal magnetic anisotropy energy," accessed from https://arxiv.org/abs/1701.04150, Applied Physics Letters, vol. 110, 022405, DOI: 10.1063/1.4973700, Jan. 16, 2017, 21 pp.

Pai et al., "Dependence of the Efficiency of Spin Hall Torque on the Transparency of Pt-Ferromagnetic Layer Interfaces," Research Gate, Physical Review B, vol. 96, No. 6, DOI:10.1103/PhysRevB.92.064426, Aug. 31, 2015, 26 pp.

Zhu et al., "Strong Damping-Like Spin-Orbit Torque and Tunable Dzyaloshinskii-Moriya Interaction Generated by Low-Resistivity Pd1-xPtx Alloys," Advanced Functional Materials, vol. 29, Issue 16, https://doi.org/10.1002/adfm.201805822, Feb. 27, 2019, 27 pp.

Zhu et al., "Highly efficient spin current generation by the spin Hall effect in Au1-xPtx," accessed from https://arxiv.org/ftp/arxiv/papers/1805/1805.02329.pdf, Physical Review Applied, vol. 10, DOI:https://doi.org/10.1103/PhysRevApplied.10.031001, Sep. 6, 2018, 5 pp.

Nozaki et al., "Large Voltage-Induced Changes in the Perpendicular Magnetic Anisotropy of an MgO-Based Tunnel Junction with an Ultrathin Fe Layer," American Physical Society, Physical Review Applied, vol. 5,DOI: 10.1103/PhysRevApplied.5.044006, Apr. 15, 2016, p. 044006-1-044006-10.

Zhang et al., "Model of orbital populations for voltage-controlled magnetic anisotropy in transition-metal thin films," American Physical Society, Physical Review B, vol. 96, Model of orbital populations for voltage-controlled magnetic anisotropy in transition-metal thin films, Jul. 28, 2017pp. 014435-1-014435-7.

Hibino et al., "Peculiar temperature dependence of electric-field effect on magnetic anisotropy in Co/Pd/MgO system," Published by AIP Publishing, Applied Physics Letters, vol. 109, http://dx.doi.org/10.1063/1.4961621, Aug. 25, 2016, pp. 082403-1-082403-4.

Kwon et al., "Voltage-Controlled Magnetic Anisotropy in Heterostructures with Atomically Thin Heavy Metals," American Physical Society, Physical Review Applied, vol. 12, DOI: 10.1103/PhysRevApplied.12.044075, Oct. 31, 2019, 044075-1-044075-6.

Amiri et al., "Electric-Field-Controlled Magnetoelectric RAM: Progress, Challenges, and Scaling," IEEE Transactions on Magnetics, vol. 51, No. 11, Nov. 2015, 7 pp.

Grezes et al., "Ultra-low switching energy and scaling in electric-field-controlled nanoscale magnetic tunnel junctions with high resistance-area product," AIP Applied Physics Letters, vol. 108, http://dx.doi.org/10.1063/1.4939446, Jan. 4, 2016, 6 pp.

Bauer et al., "Magnetic-ionic control of interfacial magnetism," Nature Materials, DOI: 10.1038/NMAT4134, Nov. 17, 2014, 8 pp.

Chu et al., "A Micromachined Kelvin Probe With Integrated Actuator for Microfluidic and Solid-State Applications," Journal of Microelectromechanical Systems, vol. 14, No. 4, DOI: 10.1109/JMEMS.2005.845453, Aug. 2005, pp. 691-698.

Manipatruni et al., "Energy-delay performance of giant spin Hall effect switching for dense magnetic memory," The Japan Society of Applied Physics, Applied Physics Express, vol. 7, 103001, http://dx.doi.org/10.7567/APEX.7.103001, Sep. 19, 2014, 5 pp.

He et al., "First principles study of the electric field effect on magnetization and magnetic anisotropy of FeCo/MgO (001) thin film," American Institute of Physics, Applied Physics Letters, vol. 99, 072503, https://doi.org/10.1063/1.3626598, Aug. 17, 2011, 4 pp.

Kato, "Giant voltage-controlled magnetic anisotropy effect in a crystallographically strained CoFe system," The Japan Society of Applied Physics, Applied Physics Express, vol. 11, 053007, https://doi.org/10.7567/APEX.11.053007, Apr. 26, 2018, 6 pp.

Zhang et al., "Model of orbital populations for voltage-controlled magnetic anisotopy in transition-metal thin films," American Physi-

(56) References Cited

OTHER PUBLICATIONS cal Society, Physical Review B, vol. 96, 014435, DOI: 10.1103/PhysRevB.96.014435, Jul. 28, 2017, 8 pp.

Shiota et al., "Opposite signs of voltage-induced perpendicular magnetic anisotropy change in CoFeB|MgO junctions with different underiayers," AIP Publishing LLC, Applied Physics Letters, vol. 103, 082410, https://doi.org/10.1063/1.4819199, Aug. 23, 2013, 5 pp.

Skowronski et al., "Perpendicular magnetic anisotropy of Ir/CoFeB/MgO trilayer system tuned by electric fields," The Japan Society of Applied Physics, Applied Physics Express, vol. 8, 053003, http://dx.doi.org/10.7567/APEX.8.053003, Apr. 24, 2015, 5 pp.

Ando et al., "Spin-transfer torque magnetoresistive random-access memory technologies for normally off computing (invited)," AIP Publishing, Journal of Applied Physics, vol. 115, 172607, https://doi.org/10.1063/14869828, Apr. 8, 2014, 7 pp.

Li et al., "Thermally stable voltage-controlled perpendicular magnetic anisotropy in Mo|CoFeB|MgO structures," AIP Publishing LLC, Applied Physics Letters, vol. 107, 142403, https://doi.org/10.1063/1.4932553, Oct. 5, 2015, 6 pp.

Wang et al., "Voltage-inducted switching in magnetic tunnel junctions with perpendicular magnetic anisoptropy," IOP Publishing, Journal of Physics D: Applied Physics, vol. 46, 074004, doi:10.1088/0022-3727/46/7/074004, Jan. 31, 2013, 13 pp.

Tao et al., "The spin Hall angle and spin diffusion length of Pd measured by spin pumping and microwave photoresistance," AIP Publishing, Journal of Applied Physics, vol. 115, 17C504, https://doi.org/10.1063/1.4862215, Jan. 16, 2014, 4 pp.

Okabayashi et al., "Perpendicular magnetic anisotropy at the interface between ultrathin Fe film and MgO studied by angular-dependent x-ray magnetic circular dichroism," AIP Publishing LLC, Applied Physics Letters, vol. 105, 122408, https://doi.org/10.1063/1.4896290, Sep. 26, 2014, 6 pp.

\* cited by examiner

WORK FUNCTION STRUCTURE FOR VOLTAGE-CONTROLLED MAGNETIC ANISOTROPY

GOVERNMENT INTEREST

This invention was made with government support under ECCS-2025124 awarded by the National Science Foundation. The government has certain rights in the invention.

This invention was made with government support under Grant No. HR0011-18-3-0004 awarded by the Department of Defense/Defense Advanced Research Projects Agency (DARPA). The government has certain rights in the invention.

TECHNICAL FIELD

This disclosure relates to magnetic devices including magnetic structures, and more particularly, magnetic tunnel junctions.

BACKGROUND

The scaling of conventional semiconductor devices may be limited by factors including device reliability and increased power consumption. Improvement in the performance of memory and computational devices is continuously pursued. Magnetic tunnel junction structures use relative orientation of two or more magnetic layers to affect resistance of the magnetic tunnel junction structure and may be used in logic and memory devices.

SUMMARY

In general, this disclosure describes various implementations of magnetic stacks that include a structure in which the work function of the materials can be tuned (named a work function structure). A magnetic stack includes a ferromagnetic layer or structure that can store data based on the magnetization state of the ferromagnetic layer or structure. The magnetic stack also includes a structure with a tuned work function that can be arranged as a single layer (e.g., an alloy), a bilayer, a tri-layer, or a sandwich structure of two materials, where the sizing and arrangement of the work function structure affects the electron concentration of the ferromagnetic layer. The sizing (e.g., thickness) and alloy composition of the work function structure may be selected to tune the electron concentration of the ferromagnetic layer, which may affect the magnetic switching energy of the ferromagnetic layer.

In some examples, a magnetic device may include a layer stack including a work function structure, a dielectric layer, and a ferromagnetic layer, where the ferromagnetic layer is positioned between the work function structure and the dielectric layer. The work function structure is configured to deplete electrons from the ferromagnetic layer or accumulate electrons in the ferromagnetic layer. A magnetization orientation of the ferromagnetic layer is configured to be switched by application of a voltage across or through the ferromagnetic layer. The magnitude of the voltage used to switch the ferromagnetic layer is affected by the work function structure.

In some examples, a method includes selecting a material for a ferromagnetic layer, selecting a first material for two outer layers of a work function structure, and selecting a second material for an inner layer of the work function structure to operate as a spin-orbit-torque channel. The method also includes determining a thickness for the work function structure based on a desired work function magnitude of the work function structure. The method further includes forming the work function structure and the ferromagnetic layer adjacent to each other.

In some examples, a method for storing a bit in a spin memory device (e.g., a magnetic tunnel junction) includes writing a bit by at least applying a first voltage across or through a work function structure to generate a spin current in the work function structure, where the spin current is configured to switch the magnetization orientation of the ferromagnetic layer. The work function structure is part of a layer stack that includes a dielectric layer. The layer stack also includes a ferromagnetic layer positioned between the work function structure and the dielectric layer. The method further includes reading the bit by applying a second voltage across the layer stack to generate an electrical current through the layer stack and comparing the electrical current or an associated resistance to a threshold level.

The details of one or more aspects of the disclosure are set forth in the accompanying drawings and the description below. Other features, objects, and advantages of the techniques described in this disclosure will be apparent from the description, drawings, and claims.

DETAILED DESCRIPTION

The disclosure describes a magnetic device including a layer stack including a work function structure and a ferromagnetic layer. The work function structure may be configured to deplete the electron concentration in the ferromagnetic layer or accumulate electrons in the ferromagnetic layer, which can allow a more efficient voltage-controlled magnetic anisotropy (VCMA) as well as bi-directional magnetization switching. This improved VCMA can allow for lower energy used to switch the magnetic orientation of the ferromagnetic layer.

An existing device may use a VCMA effect that is unidirectional, where deterministic switching of the ferromagnetic layer cannot occur with both polarities of gate voltage. Using a work function structure to deplete or accumulate electrons in the ferromagnetic free layer can tune the VMCA effect to allow for bipolar reduction of magnetic anisotropy. The bidirectional lowering of the magnetic anisotropy, through the combined actions of the VCMA effect and the work function structure, can allow for more efficient switching via voltage, electric field, spin-transfer torque, spin-orbit torque, or the like.

In existing magnetic tunnel junctions, the VCMA coefficient is in the range of one to one hundred femtojoules per volt-meter. Using a work function structure as described herein, a magnetic device of this disclosure can theoretically achieve a non-linear VCMA with a coefficient in the range of one picojoule per volt-meter. An increased VCMA coefficient can be achieved by heavily depleting the interface between a ferromagnetic layer and a dielectric layer. This depletion can be achieved using a work function structure to deplete the electron concentration of the ferromagnetic layer. By selecting thicknesses of the layers of the work function structure, the VCMA effect may be tunable. In some examples, the work function structure can be integrated with a spin Hall channel for reduced switching energy.

Figure 1:
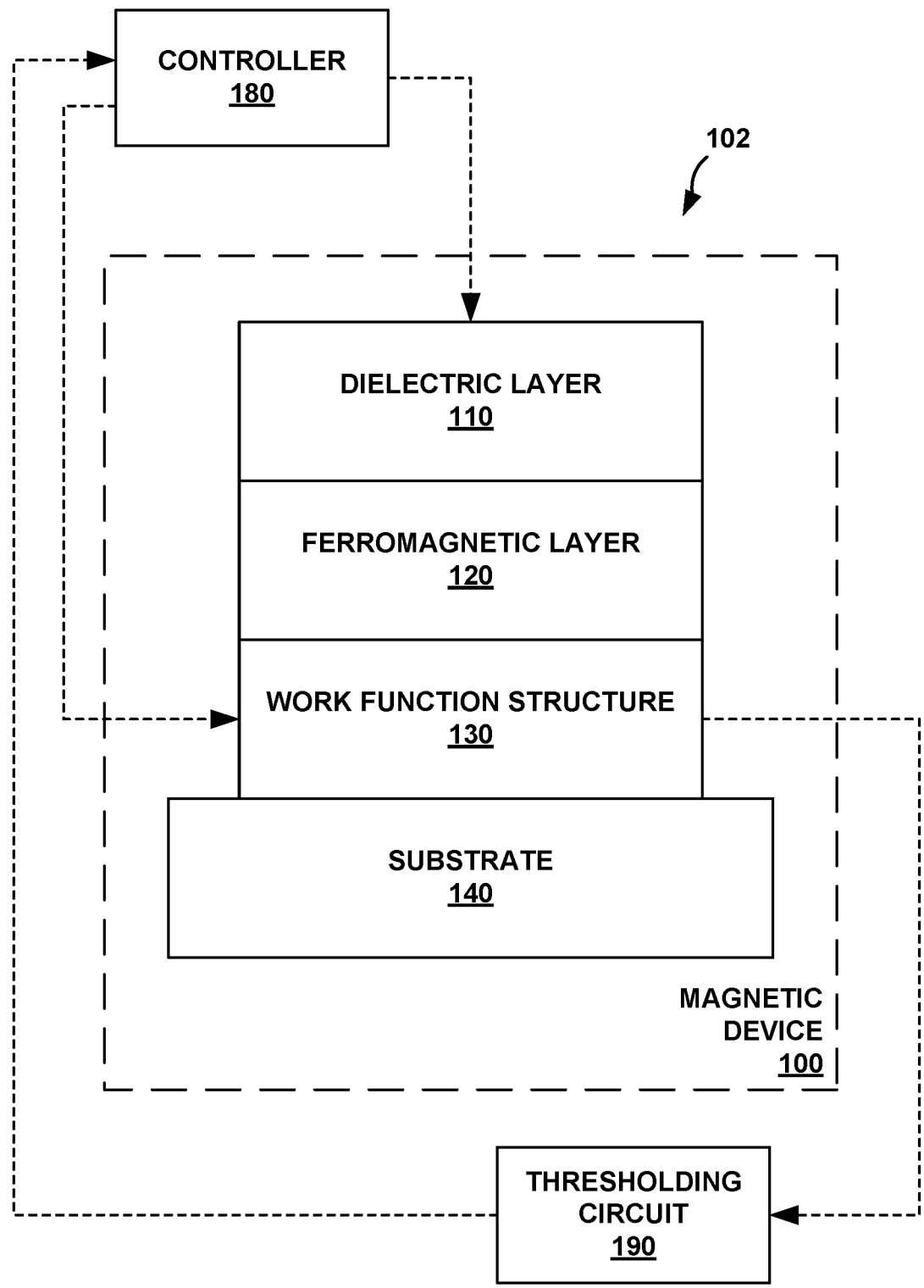
FIG. 1 is a conceptual block diagram of a magnetic device including a ferromagnetic layer positioned between a dielectric layer and a work function structure, in accordance with the techniques of this disclosure.
Figure 2:
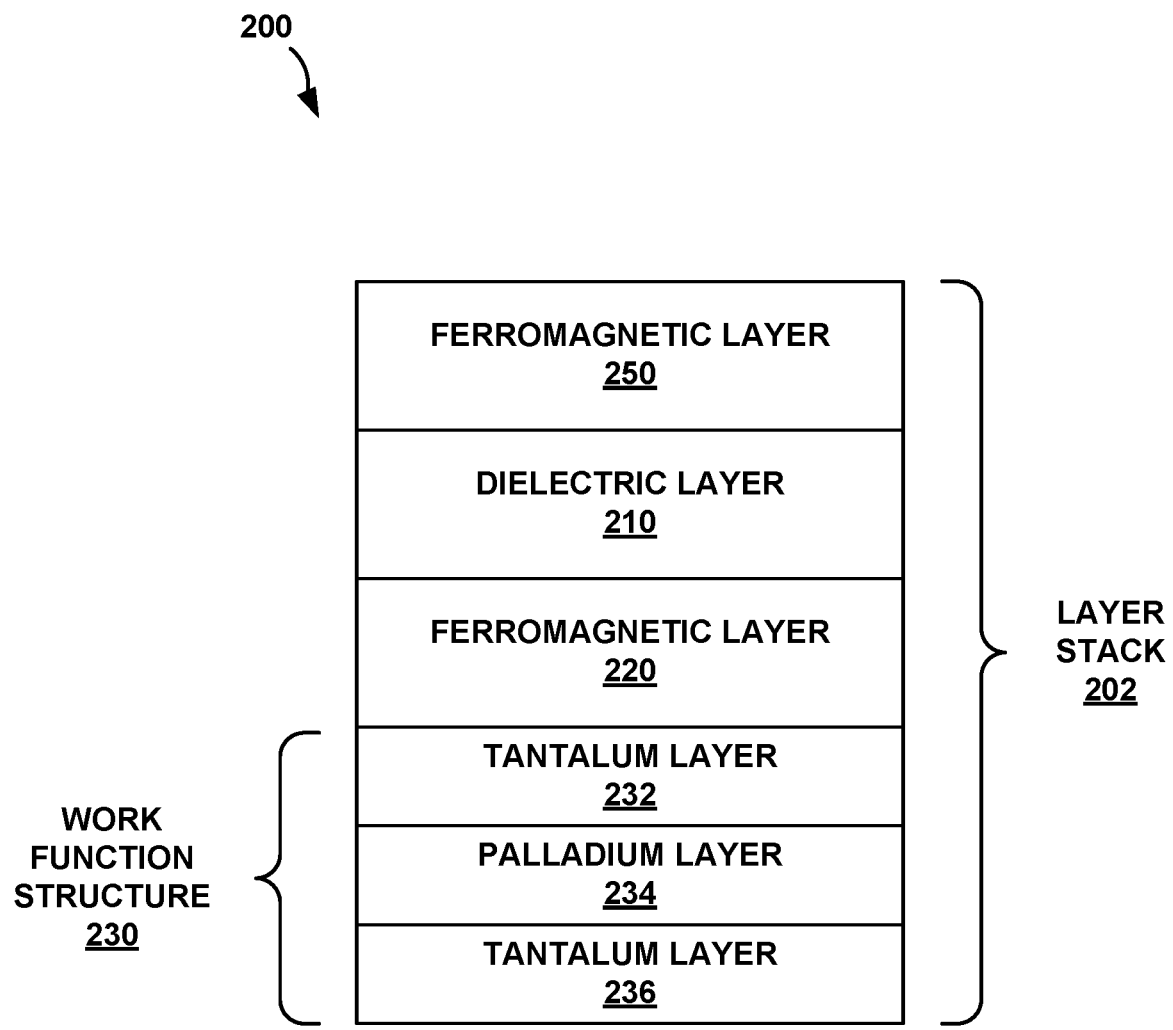
FIG. 2 is a conceptual block diagram of a magnetic device including a tantalum-palladium-tantalum sandwich, in accordance with the techniques of this disclosure.

FIG. 1 is a conceptual block diagram of a magnetic device 100 including a ferromagnetic layer 120 positioned between a dielectric layer 110 and a work function structure 130, in accordance with the techniques of this disclosure. As shown in FIG. 1, magnetic device 100 also includes substrate 140. In some examples, magnetic device 100 may also include a second ferromagnetic layer positioned on top of dielectric layer 110 such that dielectric layer 110 is positioned between the two ferromagnetic layers (as shown in FIG. 2). FIG. 1 further depicts a controller 180 and a thresholding circuit 190, where controller 180 may be configured to control the voltage across the layer stack that includes dielectric layer 110, ferromagnetic layer 120, and work function structure 130.

Dielectric layer 110 is depicted as directly contacting ferromagnetic layer 120, but alternatively there may be one or more other layers between dielectric layer 110 and ferromagnetic layer 120. Although not shown in FIG. 1, magnetic device 100 may include an insertion layer between ferromagnetic layer 120 and dielectric layer 110. The insertion layer may enhance the effect of the electric field across the layer stack, which includes dielectric layer 110, ferromagnetic layer 120, and work function structure 130. The insertion layer may include one or more of the following materials: Ir, Rh, Mg, Ta, Mo, any metallic element, or any metallic alloy. Any of the layer stacks shown in FIGS. 1-4 can include an insertion layer adjacent to a dielectric layer.

Dielectric layer 110 may include an insulator, a nitride material, a tunnel barrier material, and/or an oxide material. Suitable oxides include MgO, $AlO_x$, $MgAlO_x$, $MgAl_2O_4$, $HfO_x$, $NiO_x$, $CrO_x$, $VO_x$, $SiO_x$, $GdO_x$, $MgZn_2O_4$, $MgNi_2O_4$, ferroelectric materials, two-dimensional materials (e.g., BN) or the like. Other materials that can be used in dielectric layer 110 include $BiFeO_3$, $BaTiO_3$, and/or lead magnesium niobate-lead titanate (PMN-PT). Dielectric layer 110 may define any suitable thickness, such as between about 1 nm and about 30 nm or between about 1 nm and about 10 nm.

Additionally or alternatively, dielectric layer 110 may include two-dimensional materials (e.g. BN). Hexagonal BN can exhibit good tunnel behavior, even when used in a monolayer structure. In some examples, a cobalt iron (CoFe)/BN/cobalt (Co) MTJ can be used with a textured stack to obtain a high magnetoresistance ratio.

Ferromagnetic layer 120 may have a magnetic orientation oriented in plane or out of the plane of ferromagnetic layer 120. Additionally, in examples in which the layer stack includes a second ferromagnetic layer (e.g., a fixed layer) on the other side of dielectric layer 110, the magnetic orientation of ferromagnetic layer 120 may be either parallel/antiparallel or perpendicular with the magnetic orientation of the second ferromagnetic layer. Ferromagnetic layer 120 may include, for example, a CoFeB alloy, such as $Co_{20}Fe_{60}B_{20}$; a CoFe alloy, CoPd, CoPt, Co, Fe, FePd, FePt, FeIr, $Y_3Fe_5O_{12}$, a Co-based Heusler alloy, a Mn-based alloy (e.g., a Mn-based Heusler alloy), MnN, MnGa, MnGaN, MnGe, MnGeN, MnAl, MnBi, a Fe—Pd alloy, or ferromagnetic insulator (e.g., $Tm_3Fe_5O_{12}$, $Tb_3Fe_5O_{12}$). Example details of ferromagnetic materials are described in commonly assigned U.S. Pat. No. 10,854,257, entitled "Electric Field Switchable Magnetic Devices," issued on Dec. 1, 2020, and U.S. patent application Ser. No. 16/861,869, entitled "Electric Field Switchable Magnetic Devices," filed on Apr. 29, 2020, the entire contents of each of which are incorporated herein by reference.

Ferromagnetic layer 120 is depicted as directly contacting work function structure 130, but alternatively there may be one or more other layers between ferromagnetic layer 120 and work function structure 130. Ferromagnetic layer 120 may have any suitable thickness, such as less than about four nanometers, less than about three nanometers, less than about two nanometers, less than about one nanometer. In some examples, ferromagnetic layer 120 includes a CoFeB alloy and a thickness of about 1.2 nm. In some examples, ferromagnetic layer 120 may possess interfacial or bulk perpendicular magnetic anisotropy. The thickness and composition of ferromagnetic layer 120 may have an effect on the energy used for switching the magnetic anisotropy of ferromagnetic layer 120. The thickness and composition of ferromagnetic layer 120 may be selected so that magnetic orientation of ferromagnetic layer 120 may be easily switched when electrons are supplied to or depleted from ferromagnetic layer 120 by work function structure 130, while remaining substantially stable when switching is not desired.

Work function structure 130 may be configured to supply electrons to ferromagnetic layer 120 and/or to deplete electrons from ferromagnetic layer 120. Whether the work function structure 130 supplies or depletes electrons depends on the relative work function magnitudes of layers 120 and 130. In some examples, the work function of the work function structure 130 is larger than that of ferromagnetic layer 120, and work function structure 130 functions as an electron depletion layer (e.g., that depletes electrons from ferromagnetic layer 120). Work function structure 130 may include a sandwich structure with three layers, where the outside layers include a first material and the central or inside layer includes a second material. Alternatively, work function structure 130 may be arranged as a single layer (e.g., an alloy), a bilayer, or a tri-layer. Work function structure 130 may include one or more of the following materials: Ta, Pd, Pt, Ir, Rh, Cr, Ru, Au, W, V, Cu, $Ta_xAu_y$, $Au_xPt_y$, $Au_xCu_{1-x}$, $Pd_xPt_y$, $Pt_xCu_y$, $W_xTa_y$, one or more semiconductor materials such as GaAs, GaMnAs, Si, Ge, FeSi, and half-Heusler alloys, or the like.

In accordance with the techniques of this disclosure, work function structure 130 can deplete electrons from and/or supply electrons to ferromagnetic layer 120 to reduce the energy to switch the magnetization state of ferromagnetic layer 120. In some examples, work function structure 130 may be configured to act as an electron depletion/accumulation underlayer and a spin Hall channel. In addition, layer stack 102 has a relatively simple arrangement, as compared to some existing magnetic devices that have eight or more layers, and this simple arrangement can result in reduced manufacturing costs and lower manufacturing complexity. Work function structure 130 can be designed to simultaneously play a role as a spin-orbit torque (SOT) generation layer for ferromagnetic layer 120.

Substrate 140 may include an insulative material such as silicon dioxide that does not conduct electricity. Substrate 140 can provide a foundation or a base for constructing layer stack 102 on top of substrate 140. Substrate 140 can also provide a foundation for the construction of additional magnetic devices that are not shown in FIG. 1. Work function structure 130 is depicted as directly contacting substrate 140, but alternatively there may be one or more other layers between work function structure 130 and substrate 140.

Controller 180 may be configured to also control the voltage and current across or through work function structure 130. Thresholding circuit 190 may receive an electrical current that passes through work function structure 130. Thresholding circuit 190 may be configured to determine whether the electrical current is greater than a threshold level in order to determine the bit value stored by ferromagnetic layer 120.

Controller 180 may be configured to write a bit to magnetic device 100 by modulating the voltage across or through work function structure 130 or the voltage across the layer stack to switch a magnetization state of ferromagnetic material 120, e.g., to one of two antiparallel stable orientations. By modulating the voltage across or through work function structure 130, controller 180 may be able to inject electrical current into work function structure 130, which can generate a spin current inside work function structure 130. The spin current inside work function structure 130 can switch the magnetization state of ferromagnetic material 120, which is called spin-orbit torque. Additionally or alternatively, by modulating the voltage across the layer stack, controller 180 may be configured to switch the magnetization state of ferromagnetic layer 120 using spin-transfer torque.

Controller 180 may be configured to read the bit value stored in ferromagnetic layer 120 based on electrical current 180 through work function structure 130. For example, controller 180 may be configured to modulate a voltage across the layer stack to a predefined read voltage level. In some examples, controller 180 is configured to connect a drain terminal to thresholding circuit 190 so that thresholding circuit 190 can receive the current conducted by the layer stack. Thresholding circuit 190 may be configured to compare the current (or another signal that indicates a magnitude of the current) or a resistance associated with the current to one or more threshold levels to determine values for the bit value. Controller 180 may be configured to then determine the bit value bits based on an output generated by thresholding circuit 190.

Although thresholding circuit 190 and controller 180 are depicted outside of magnetic device 100, thresholding circuit 190 and/or controller 180 may also be located partially or completely inside or integrated with magnetic device 100.

The techniques attributed to controller 180 may be implemented, at least in part, in hardware, software, firmware or any combination thereof. For example, various aspects of the techniques may be implemented within one or more processors, including one or more microprocessors, digital signal processors (DSPs), application-specific integrated circuits (ASICs), field-programmable gate arrays (FPGAs), memory controllers, or any other equivalent integrated or discrete logic circuitry, as well as any combinations of such components, embodied in programmers, such as physician or patient programmers, stimulators, remote servers, or other devices. The term "processor" or "processing circuitry" may generally refer to any of the foregoing logic circuitry, alone or in combination with other logic circuitry, or any other equivalent circuitry.

Such hardware, software, firmware may be implemented within the same device and/or within separate devices to support the various operations and functions described in this disclosure. For example, any of the techniques or processes described herein may be performed within one device or at least partially distributed amongst two or more devices. In addition, any of the described units, modules or components may be implemented together or separately as discrete but interoperable logic devices.

The techniques described in this disclosure may also be embodied or encoded in an article of manufacture including a non-transitory computer-readable storage medium encoded with instructions. Instructions embedded or encoded in an article of manufacture including a non-transitory computer-readable storage medium encoded, may cause one or more programmable processors, or other processors, to implement one or more of the techniques described herein, such as when instructions included or encoded in the non-transitory computer-readable storage medium are executed by the one or more processors. Example non-transitory computer-readable storage media may include RAM, ROM, programmable ROM (PROM), erasable programmable ROM (EPROM), electronically erasable programmable ROM (EEPROM), flash memory, magnetic media, optical media, or any other computer readable storage devices or tangible computer readable media.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache). Elements and functionality of controller 180 may be programmed with various forms of software. The one or more processors may be implemented at least in part as, or include, one or more executable applications, application modules, libraries, classes, methods, objects, routines, subroutines, firmware, and/or embedded code, for example.

In some examples, magnetic device 100 is configured to operate as a random bit generator, for example, for a stochastic computing device or a stochastic spiking neural network. In some examples, by controlling the bias voltage applied to layer stack 102, controller 180 may be able to control the thermal stability of ferromagnetic layer 120 so that thermal energy at room temperature is sufficient to cause switching between the ferromagnetic coupled and antiferromagnetic coupled states. In such cases, layer stack 102 may be randomly switched between high and low resistance states.

In some examples, the sign of ferromagnetic layer 120 can be oscillated so that bias voltage at room temperature is sufficient to cause switching between the ferromagnetic coupled and anti-ferromagnetic coupled states. Similar to above, in such cases, ferromagnetic layer 120 may be randomly switched between high and low resistance states in intervals on the order of nanoseconds or several-hundred picoseconds. This may be used to produce random bits, e.g., as part of a random bit stream for a stochastic computing device or a stochastic spiking neural network.

Additionally or alternatively, magnetic device 100 can be used for neuromorphic computing applications because the magnetization state of ferromagnetic layer 120 can operate similar to a stochastic synapse and/or a neuron. A stochastic synapse is a system where the synaptic weights are given by probability rather than by analog amplitudes. Every synapse has a weight that the synapse multiplies with an input to generate an output. Analog synapse can have any number between zero and one for the synaptic weight. A stochastic synapse generates a zero or one, but the probability of zero or one can be used to assign an analog value. The stochastic synapse gives a weight by probability rather than an amplitude.

FIG. 2 is a conceptual block diagram of a magnetic device 200 including a work function structure 230 that includes a tantalum-palladium-tantalum sandwich structure, in accordance with the techniques of this disclosure. Magnetic device 200 includes layer stack 202, which is made up of at least dielectric layer 210, ferromagnetic layer 220, work function structure 230, and ferromagnetic layer 250. Work function structure 230 includes the three layers of the tantalum-palladium-tantalum sandwich structure shown in FIG. 2. However, in some examples, work function structure 230 includes a single layer, two layers, or more than three layers.

Ferromagnetic layer 250 is depicted as directly contacting dielectric layer 210, but alternatively there may be one or more other layers between ferromagnetic layer 250 and dielectric layer 210. Ferromagnetic layer 220 may be referred to as a free layer because the magnetization state of ferromagnetic layer 220 can be switched or modulated. Together, ferromagnetic layer 220 and work function structure 230 may be referred to as a composite free layer. Ferromagnetic layer 250 may be referred to as a fixed layer or a reference layer because the magnetization state of ferromagnetic layer 250 may be unswitchable at voltages and magnetic fields to which magnetic device 200 is exposed during normal operation, or at least much more difficult to switch than the magnetization state of ferromagnetic layer 220. For example, the magnetization state of ferromagnetic layer 250 may be substantially fixed, at least compared to the magnetization state of ferromagnetic layer 220.

Work function structure 230 includes tantalum layer 232, palladium layer 234, and tantalum layer 236, where layers 232 and 236 can be referred to as first and second outer layers, and layer 234 can be referred to as an inner layer. Although not shown in FIG. 2, layer stack 202 and work function structure 230 may also include additional layers, such as a second sandwich structure or one or more spacer layers. In some examples, work function structure 230 is more or less complex than the sandwich structure shown in FIG. 2. Additional layers can be used to tune the work function magnitude at the interface of ferromagnetic layer 220 and work function structure 230. Although FIG. 2 depicts a sandwich structure of layers 232, 234, and 236, other work function structures are possible, such as a bi-layer including only layers 232 and 234.

Each of layers 232, 234, and 236 may include polycrystalline sputtered films. Outer layers 232 and 236 as deposited may consist of tantalum, e.g., tantalum in an elemental form or elemental state. Although described herein as including the same material(s), outer layers 232 and 236 may include different materials, in some examples. Inner layer 234 as deposited may consist of palladium, e.g., palladium in an elemental form or elemental state. Using a pure material (e.g., in elemental form), rather than an alloy, reduces or eliminates the uncertainty of the work function magnitude of work function structure 230. Moreover, layer 236 may adhere to substrate 240 more securely than layer 234, so layer 236 may add structural stability to magnetic device 200.

Additionally or alternatively, layer 234 may include platinum, e.g., platinum in an elemental form or elemental state. Platinum has a relatively large work function magnitude of 5.6 electron-volts, which allows for strong electron depletion of ferromagnetic layer 220. Platinum can be used for spin-orbit transfer switching of the magnetization state of ferromagnetic layer 220. Platinum has a similar crystal structure to palladium, so tantalum layers 232 and 236 can be used with a platinum layer to more easily nucleate ferromagnetic layer 220.

In some examples, work function structure 230 may include a single layer of multiple elements, such as cobalt and palladium. The elements may be co-deposited or co-sputtered together by forming a first sublayer of the first element followed by a second sublayer of the second element. Each sublayer of a single element may be one or more atoms thick. A superlattice structure may form within each sublayer and across the sublayers. Although there may be multiple sublayers in work function structure 230, work function structure 230 may be referred to as a single layer because the crystal structure that forms across the sublayers.

Work function structure 230 may be configured to pull electrons out of ferromagnetic layer 220 and/or push electrons into ferromagnetic layer 220. Thus, the electron concentration of ferromagnetic layer 220 is affected by the materials used in work function structure 230 and the sizing of each layer of work function structure 230. The VCMA coefficient of layer stack 202 is based on the electron concentration of ferromagnetic layer 220. For example, the VCMA coefficient of layer stack 202 may be 113 femtojoules per volt-meter, which may be 3.2 times larger than using tantalum alone in a work function structure without any palladium or platinum.

In some examples, a thickness of dielectric layer 210 is greater than zero or one nanometers and less than about twenty, ten, six, five, four, or three nanometers. A thickness of ferromagnetic layer 220 may be greater than zero or one nanometers and less than about twenty, ten, six, five, four, three, or two nanometers. A thickness of outer layer 232 may be greater than zero or one nanometers and less than about twenty, ten, six, five, four, three, or two nanometers. A thickness of inner layer 234 may be greater than zero, one, two, or five nanometers and less than about thirty, twenty, ten, six, five, four, three, or two nanometers. A thickness of outer layer 236 may be greater than zero or one nanometers and less than about twenty, ten, six, five, four, three, two, or one nanometers. A thickness of ferromagnetic layer 250 may be greater than zero or one nanometers and less than about thirty, twenty, ten, six, five, four, three, or two nanometers. As one just example arrangement for illustrative purposes, dielectric layer 210 may be two nanometers thick, ferromagnetic layer 220 may be 1.2 nanometers thick, outer layer 232 may be one nanometer thick, inner layer 234 may be two nanometers thick, and outer layer 236 may be five angstroms thick.

Figure 3A:
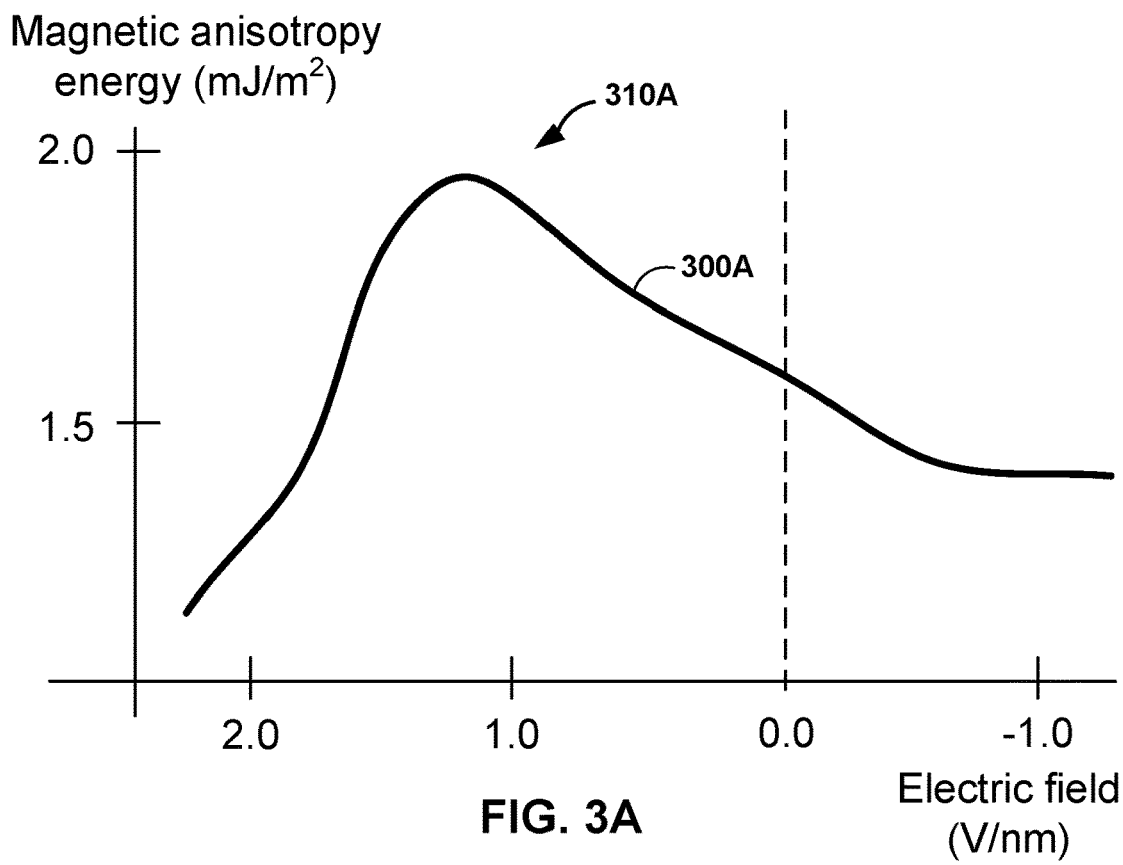
FIGS. 3A and 3B are plots of the magnitudes of the magnetic anisotropy energy and voltage-controlled magnetic anisotropy versus electric field.
Figure 3B:
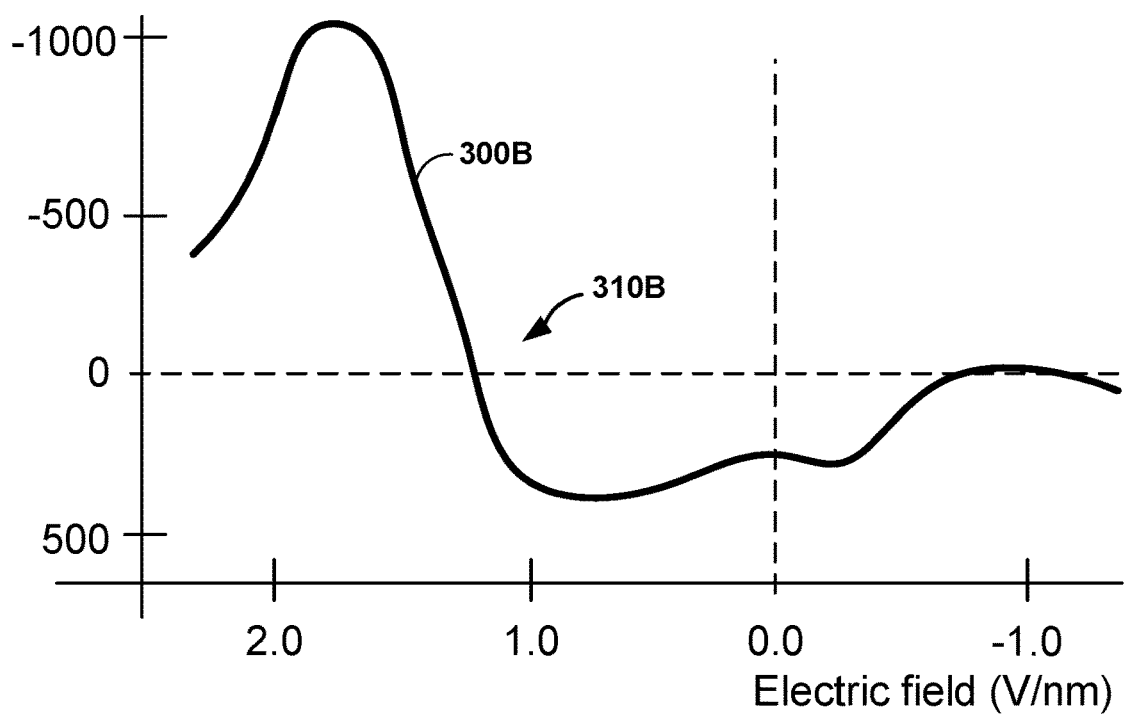

FIGS. 3A and 3B are plots of the magnitudes of the magnetic anisotropy energy and VCMA versus electric field. FIGS. 3A and 3B show the results of density function theory calculations for an Fe/MgO structure. A structure with a different ferromagnetic material or a different dielectric material may have a bidirectional or peak VCMA at a different electric field value, possibly at a negative electric field value (e.g., resulting from electron accumulation). FIG. 3A shows that magnetic anisotropy energy 300A has a maximum magnitude of approximately two millijoules per square meter near an electric field of 1.2 volts per nanometer at point 310A. Point 310A may be referred to as a bidirectional point because increasing or decreasing the electric field leads to a reduction in the magnetic anisotropy energy, thereby realizing bipolar magnetization switching. The VCMA magnitude 300B shown in FIG. 3B is the derivative of the magnetic anisotropy energy with respect to electric field. Thus, VCMA magnitude 300B is zero near an electric field of 1.2 volts per nanometer, where magnetic anisotropy energy 300A has a maximum magnitude. In examples in which the dielectric layer is very thin (e.g., less than five nanometers), an electric field of 1.2 volts per nanometer is not possible without risking a breakdown of the dielectric layer. In addition, a large electric field applied across a layer stack may increase the power dissipation in the magnetic device.

An applied voltage can create the electric field across the layer stack. Additionally or alternatively, the work function structure of the layer stack can create an effective electric field by depleting electrons from or supplying electrons to the ferromagnetic layer. For a layer stack including a cobalt-iron-boron layer and a tantalum-palladium-tantalum sandwich underlayer, the effective electric field created by the sandwich underlayer may have a positive magnitude, resulting in electron depletion of the ferromagnetic layer. Conversely, in examples in which the layer stack includes a cobalt-iron-boron layer and a tantalum-only underlayer, the effective electric field created by the tantalum underlayer may have a negative magnitude, resulting in the addition of electrons to the ferromagnetic layer.

In examples in which there is nearly zero electric field (e.g., between about +1.0 V/nm and about −0.5 V/nm), small changes in the electric field may cause substantially linear changes in magnetic anisotropy energy, while VCMA magnitude 300B may remain approximately constant near negative three hundred femtojoules per volt-meter. In examples in which the ferromagnetic layer has an increased electron concentration (e.g., at electric fields less than about −0.5 V/nm in FIGS. 3A and 3B), magnetic anisotropy energy 300A may be roughly constant, and VCMA magnitude 300B may be approximately zero. The ferromagnetic layer has an increased electron concentration in examples in which the work function magnitude of the work function underlayer is lower than the work function magnitude of the ferromagnetic layer. In such examples, the work function underlayer can supply electrons to the ferromagnetic layer, thereby creating an effective electric field with a negative polarity.

In examples in which the ferromagnetic layer is electron depleted, the change in magnetic anisotropy energy 300A may be bidirectional, and VCMA magnitude 300B may reach a maximum of negative 1.1 picojoules per volt-meter. The bidirectionality of magnetic anisotropy energy 300A and VCMA magnitude 300B occurs near 1.2 volts per nanometer in the example shown in FIGS. 3A and 3B (e.g., points 310A and 310B), where magnetic anisotropy energy 300A decreases with an increase or decrease in the electric field. The ferromagnetic layer may be this heavily electron depleted in examples in which the work function magnitude of the work function underlayer is much higher than the work function magnitude of the ferromagnetic layer. In such examples, the work function underlayer can deplete electrons from the ferromagnetic layer, thereby creating an effective electric field with a positive polarity.

When in contact, the Fermi levels of two materials with different work functions will come to an equilibrium. This equalization affects the filling of electron bands and creates an effective voltage that depletes the lower-work-function material of electrons and increases the electron concentration in the higher-work-function material. The anisotropy of a ferromagnetic material is highly dependent on what bands are filled. Gating (e.g., applying a voltage across the layer stack) can further modulate the electron concentration in the materials, thereby allowing for much higher levels of electron depletion.

Figure 4A:
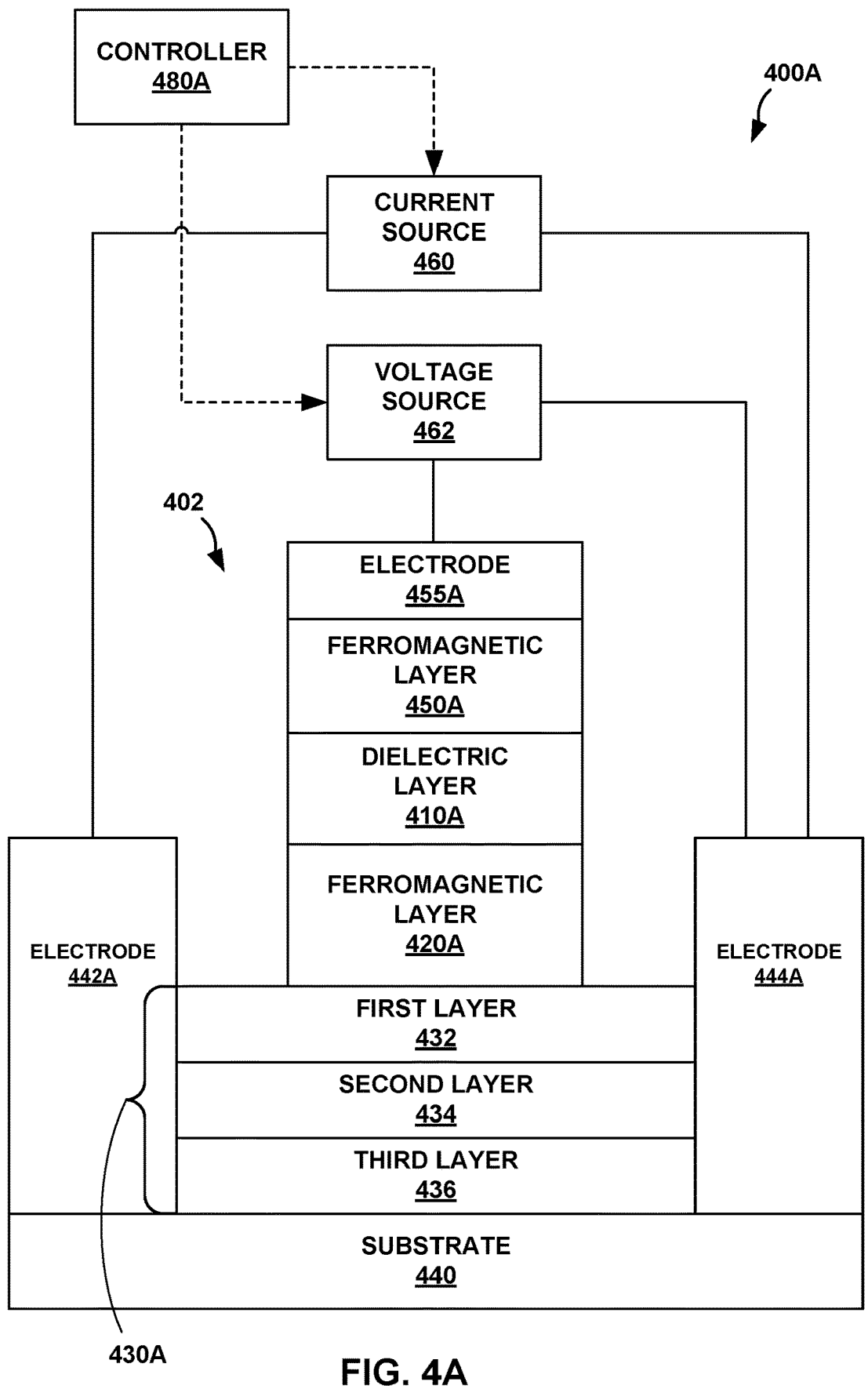
FIG. 4A is a conceptual block diagram of a magnetic device and a controller configured to operate voltage sources, in accordance with the techniques of this disclosure.

FIG. 4A is a conceptual block diagram of a magnetic device 400A and a controller 480A configured to operate sources 460 and 462, in accordance with the techniques of this disclosure. Controller 480A may be configured to control current source 460 to generate a current through work function structure 430A by, for example, generating a voltage difference between electrodes 442A and 444A. By generating a sufficient voltage difference between electrodes 442A and 444A, controller 480A may be configured to cause a current to flow between electrodes 442A and 444A through work function structure 430A. Electrodes 442A, 444A, and 455A may include metal materials such as copper, silver, gold, titanium, and/or any other conductive material. In some examples, electrodes 442A and 444A may be oriented vertically with respect to work function structure 430A, such that electrodes 442A and 444A are positioned on the top and bottom of work function structure 430A. This vertical orientation can allow for a voltage to be applied through work function structure 430A.

Controller 480A may be configured to write a bit value to layer stack 402 by controlling current source 460 to generate a current through work function structure 430A. The current flowing through work function structure 430A may cause the magnetization state of ferromagnetic layer 420A to switch because of the spin-orbit torque generated in work function structure 430A.

Controller 480A may be configured to control voltage source 462 to generate a voltage across layer stack 402. By generating a sufficient voltage across layer stack 402, controller 480A may be configured to cause a current to flow between electrodes 444 and 455A. Controller 480A may be configured to read or write a bit value to layer stack 402 by controlling voltage source 462 to generate a current through layer stack 402. For example, the current flowing through layer stack 402 or the electric field through layer stack 402 can cause the magnetization state of ferromagnetic layer 420A to switch because of the spin-transfer torque generated in work function structure 430A. The current flowing through layer stack 402 for writing a data bit may be larger than the current used for reading the bit value from layer stack 402.

Figure 4B:
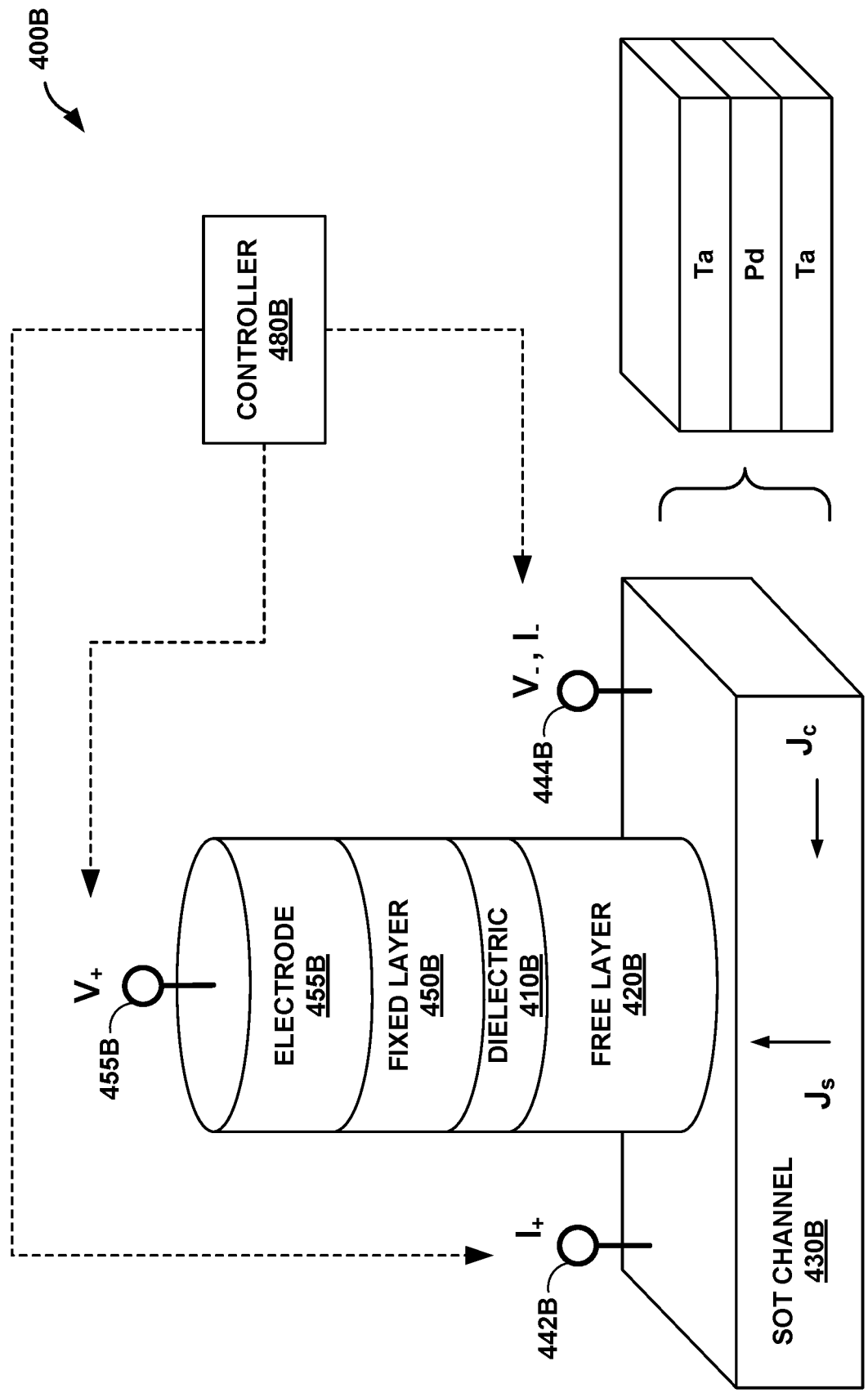
FIG. 4B is a conceptual block diagram of a three-terminal device, in accordance with the techniques of this disclosure.

FIG. 4B is a conceptual block diagram of a three-terminal device 400B, in accordance with the techniques of this disclosure. Controller 480B can generate a charge current Jc through SOT channel 430B by applying a voltage across terminals 442B and 444B. SOT channel 430B is shown in FIG. 4B as including a tri-layer sandwich structure of tantalum and palladium, but other materials are possible, and more or fewer layers are possible. Spin current Js may interact with free layer 420 to switch the magnetization state of free layer 420.

The charge current Jc flowing through SOT channel 430B may not flow into free layer 420B but may instead generate a spin current Js through spin-orbit interactions in SOT channel 430B. The spin current Js may push the positive-oriented electrons to the top of SOT channel 430B and push the negative-oriented electrons to the top of SOT channel 430B. The net change in the spin polarization is effectively a current of spins of the electrons.

In some examples, one of terminals 442B and 444B may be left out of the design of device 400B, such that device 400B only has two terminals (e.g., terminals 442B and 455B). For a two-terminal device, controller 480B may be configured to write a bit and read a bit using different voltages across the layer stack of device 400B, where a magnitude of the write voltage may be greater than a magnitude of the read voltage. The voltage across the layer stack may create an electric field through dielectric layer 410B, free layer 420B, and fixed layer 450B that can switch the magnetization state of free layer 420B. Additional example details of two-terminal devices are described in commonly assigned U.S. Pat. No. 10,283,561, entitled "Two-Terminal Spintronic Devices," issued on May 7, 2019, the entire contents of which are incorporated herein by reference.

Figure 5B:
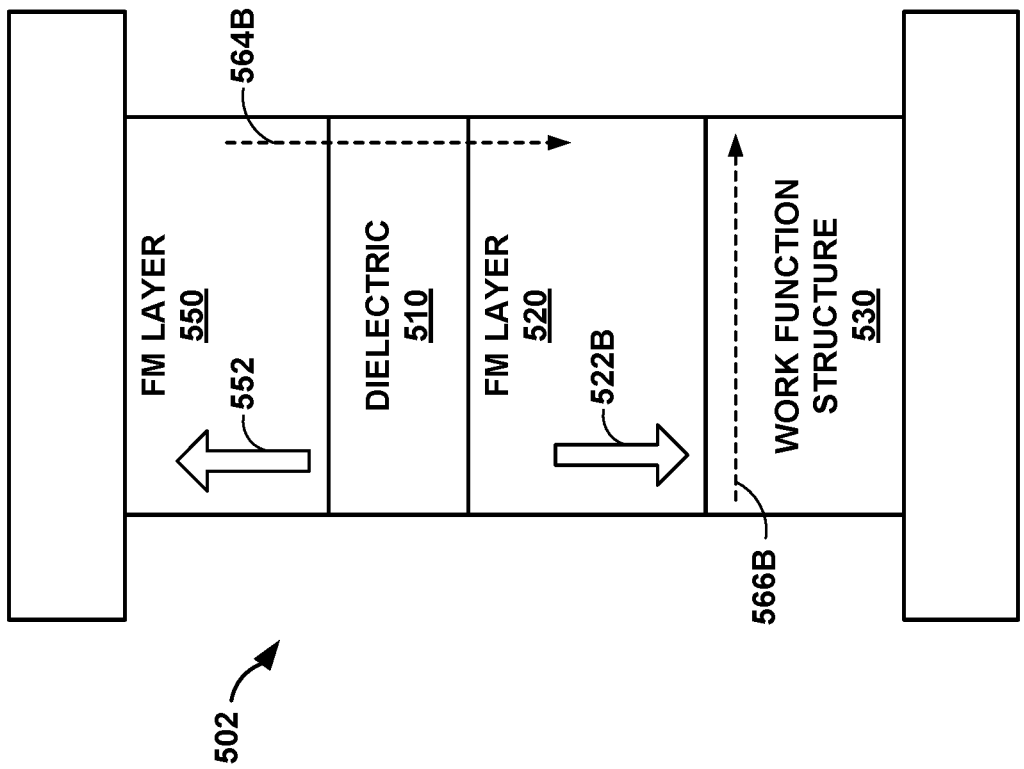
FIGS. 5A and 5B are conceptual diagrams of a magnetic tunnel junction, in accordance with examples of the disclosure.
Figure 5A:
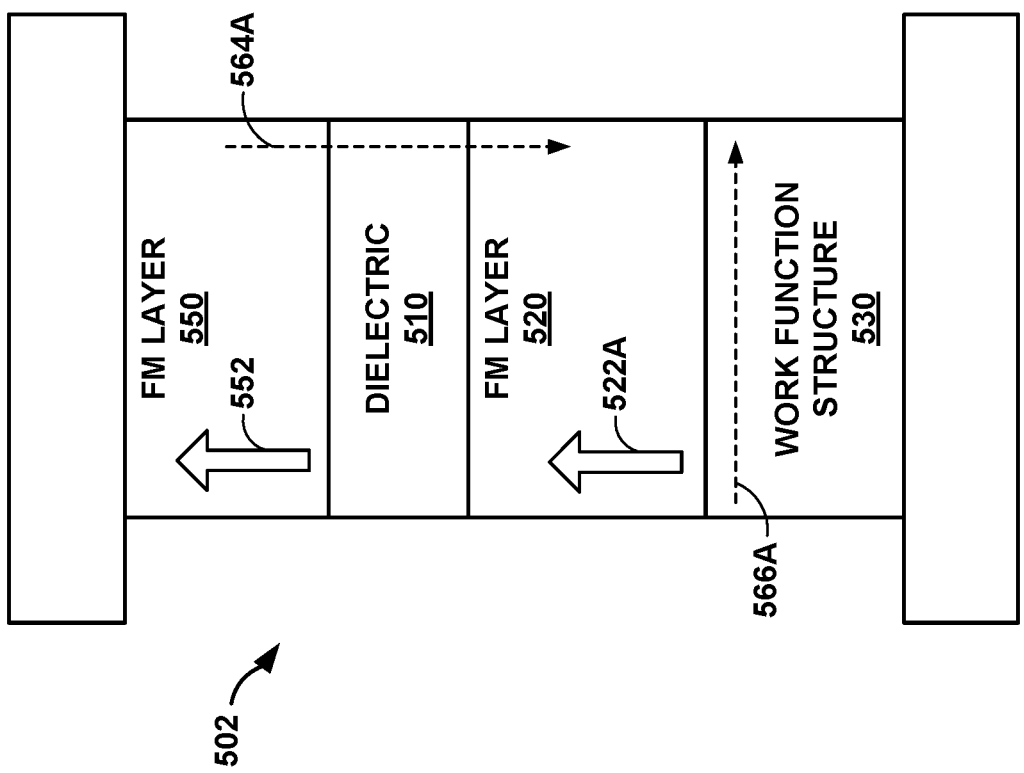

FIGS. 5A and 5B are conceptual diagrams of a magnetic tunnel junction, in accordance with examples of the disclosure. The magnetic tunnel junction shown in FIGS. 5A and 5B include dielectric layer 510 and ferromagnetic layers 520 and 550. The magnetic tunnel junction can store a data bit in the magnetization state of ferromagnetic layer 520. The ferromagnetic layers 520 and 550 could have in-plane or perpendicular magnetic anisotropy.

To read the value of the data bit, a controller may be configured to cause charge current 564A or 564B to pass through layers 510, 520, and 550. When charge current 564A or 564B is passed through the magnetic tunnel junction, the resistance depends on whether the magnetization states 522A, 552B, and 552 of ferromagnetic layers 520 and 550 are parallel or antiparallel. Parallel magnetization states 522A and 552 results in low resistance, and antiparallel magnetization states 522B and 552 results in high resistance. Although shown as left-right orientations, magnetization states 522A, 522B, and 552 may instead have up-down orientations. The charge current becomes spin polarized while passing through ferromagnetic layers 520 and 550. The relative orientation of the spin and magnetization will either produce low or high resistance. This property is called tunneling magnetoresistance.

Thus, in examples in which controller causes a particular voltage across layers 510, 520, and 550, the controller can determine the bit value stored in ferromagnetic layer 520 based on the magnitude of the current conducted through layers 510, 520, and 550. For example, a thresholding circuit may be configured to compare an indication of the current or a resistance value that is associated with the current to a threshold level. The controller may be configured to determine the bit value stored in ferromagnetic layer 520 based on an output of the thresholding circuit.

A controller may be configured to write a bit to ferromagnetic layer 520 by switching the magnetization state 522A or 522B of ferromagnetic layer 520. The controller may be configured to switch the magnetization state of ferromagnetic layer 520 using voltage and/or spin-transfer torque and/or spin-orbit torque. The controller can use spin-transfer torque by modulating the voltage across the magnetic tunnel junction to cause current 564A or 564B to conduct through the magnetic tunnel junction. A large enough current or a large enough electric field can write a data bit by switching the magnetization state 522A or 522B by spin transfer torque. The magnitude of a read current may be much less than the magnitude of a write current.

Additionally or alternatively, a controller may be configured to switch the magnetization state of ferromagnetic layer 520 using spin-orbit torque by modulating the voltage across or through work function structure 530 to cause current 566A or 566B to conduct through work function structure 530. The spin polarized electrons of currents 566A and 566B will accumulate at the interface of ferromagnetic layer 520 and work function structure 530. The relative orientations of the spin polarized electrons and magnetization state 522A or 522B results in a resistance change. For example, the spin polarized electrons are parallel with magnetization state 522A, which results in low resistance. The spin polarized electrons are antiparallel with magnetization state 522B, which results in high resistance.

Figure 6:
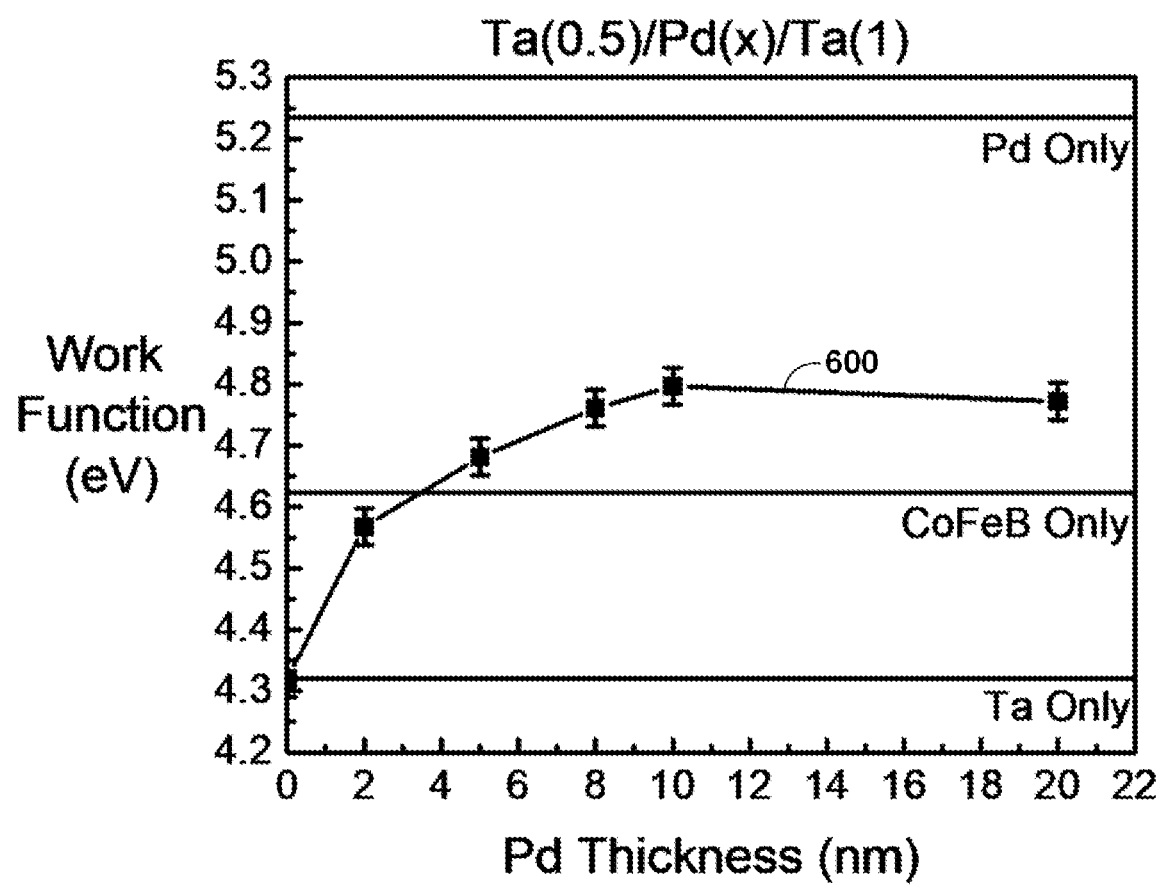
FIG. 6 is a plot of the magnitude of the work function versus the thickness of a palladium layer in a work function structure, in accordance with the techniques of this disclosure.

FIG. 6 is a plot of the magnitude of the work function versus the thickness of a palladium layer in a work function structure, in accordance with the techniques of this disclosure. Line 600 represents the work function magnitude in electron volts at various thickness for the palladium layer of a tantalum-palladium-tantalum sandwich structure. FIG. 6 shows the work function magnitude at thicknesses of two, five, eight, ten, and twenty nanometers for the palladium layer. For the experimental results shown in FIG. 6, the thickness of the top tantalum layer is held constant at five angstroms, and the thickness of the bottom tantalum layer is held constant at ten angstroms. By varying the thickness of the palladium layer, the work function magnitude of the sandwich structure can be tuned to values between 4.32 electron-volts and 4.75 electron-volts.

At a palladium thickness of zero nanometers, the work function magnitude of the work function structure is equal to the work function magnitude of tantalum alone. Table I provides approximate work function magnitudes for tantalum, palladium, platinum, cobalt-iron-boron, and other materials.

TABLE I

| approximate work function magnitudes in electron-volts | | | | | | | |
|---|---|---|---|---|---|---|---|
| Material | Pt | Pd | Ru | W | Cr | Ta | $Co_{20}Fe_{60}B_{20}$ |
| Polycrystal work function (eV) | 5.64 | 5.2 | 4.71 | 4.55 | 4.5 | 4.25 | 4.63 |

The work function structure, which may include a palladium layer, can pull electrons out of a nearby ferromagnetic layer, depending on the relative work function magnitudes of each structure. The ratio between the thickness of the palladium layer and the thickness of the tantalum layer allows a designer to tune or adjust how many electrons are depleted from the ferromagnetic layer. A thicker palladium underlayer may pull more electrons out of the ferromagnetic layer, but there is a saturation point around ten nanometers in the example shown in FIG. 6. As shown in FIG. 6, work function magnitude 600 is proportional to the palladium thickness for thicknesses between zero and ten nanometers. For palladium thicknesses greater than ten nanometers, work function magnitude 600 is relatively constant at about 4.8 electron volts, which is greater than the work function magnitude of cobalt-iron-boron, a common ferromagnetic material.

The work function structure can pull electrons out of the ferromagnetic layer when the work function magnitude of the work function structure is higher than the work function magnitude of the ferromagnetic layer. In contrast, if the work function magnitude of the palladium layer is lower than the work function magnitude of the ferromagnetic layer, the work function structure will supply electrons to the ferromagnetic layer. By selecting the thickness of the palladium underlayer, the work function magnitude of the work function structure can be modulated. Thus, by selecting the thickness of the palladium underlayer, the electron concentration of the ferromagnetic layer can be modulated. In some examples, depleting the ferromagnetic layer of electrons results in a larger VCMA effect for the ferromagnetic layer, which lowers the energy needed to switch the magnetization state of the ferromagnetic layer.

Figure 7A:
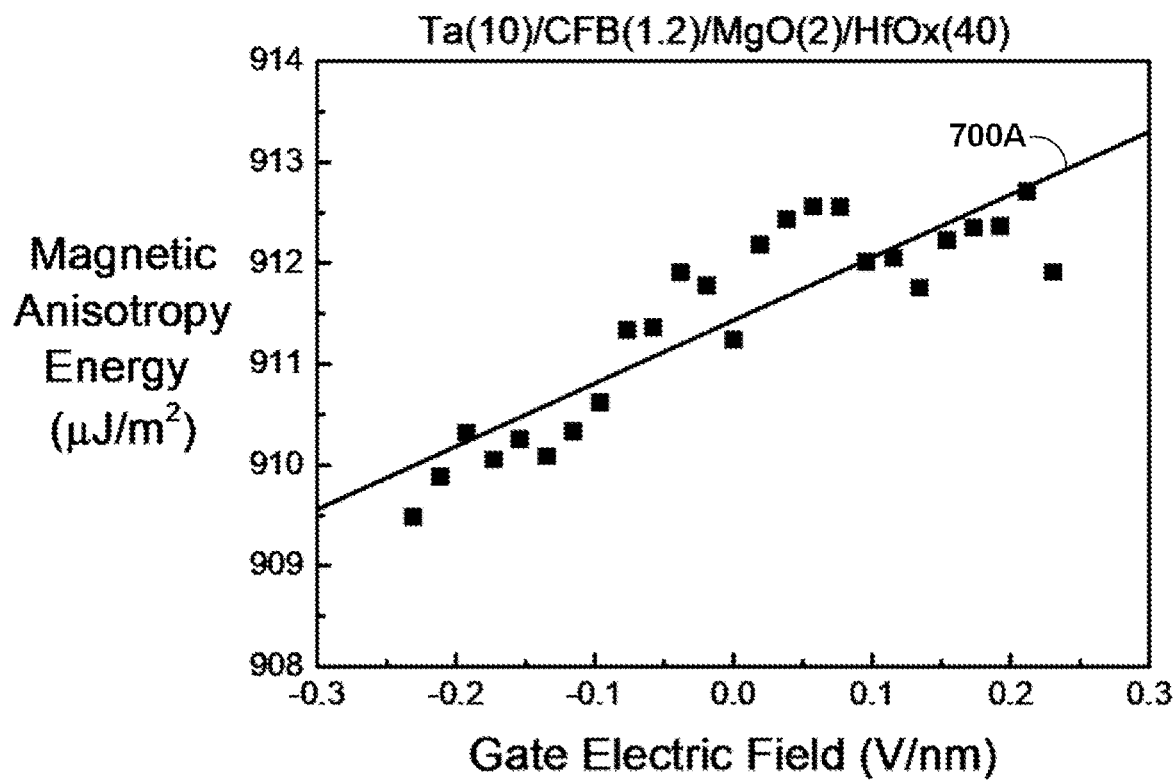
FIGS. 7A and 7B are plots of magnetic anisotropy energy versus the electric field applied at the gate of a magnetic device, in accordance with the techniques of this disclosure.
Figure 7B:
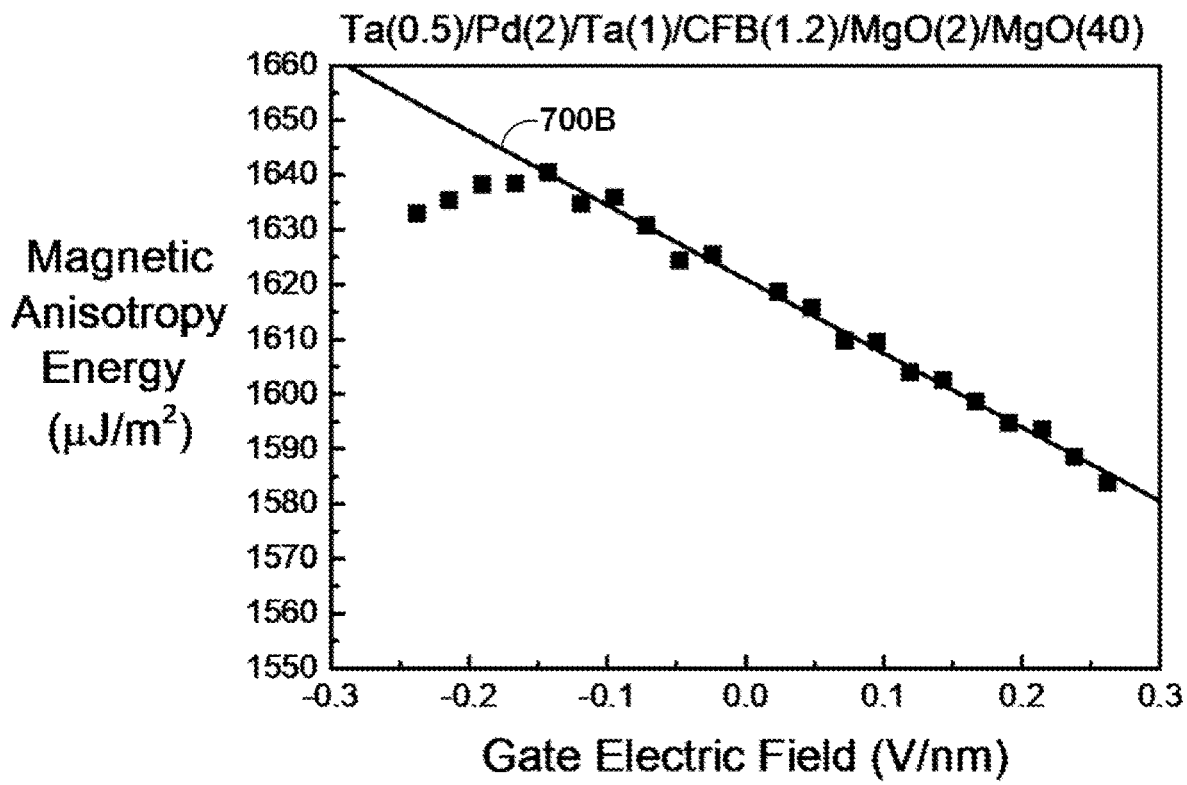

FIGS. 7A and 7B are plots of magnetic anisotropy energy versus the electric field applied at the gate of a magnetic device, in accordance with the techniques of this disclosure. The plot shown in FIG. 7A depicts the experimental results for a work function structure including a ten-nanometer layer of tantalum adjacent to a twelve-angstrom layer of cobalt-iron-boron. The plot shown in FIG. 7B depicts the experimental results for a work function structure including a sandwich structure of tantalum-palladium-tantalum adjacent to a twelve-angstrom layer of cobalt-iron-boron. The sandwich structure used for FIG. 7B includes a two-nanometer layer of palladium positioned between a one-nanometer layer of tantalum and a five-angstrom layer of tantalum, where the one-nanometer layer of tantalum is adjacent to the layer of cobalt-iron-boron.

The VCMA coefficient for each experiment is equal to the slope of lines 700A and 700B. The VCMA coefficient for the tantalum-only work function structure used for FIG. 7A is five femtojoules per volt-meter. The VCMA coefficient for the tantalum-palladium-tantalum work function structure used for FIG. 7B is negative 113 femtojoules per volt-meter. A work function structure with a palladium layer that is at least four nanometers thick should result in decreased electron concentration in the ferromagnetic layer moving the turning point closer to zero electric field. The turning point refers to the bidirectional point where an increase or a decrease in electron depletion results in lower magnetic anisotropy energy.

Figure 8:
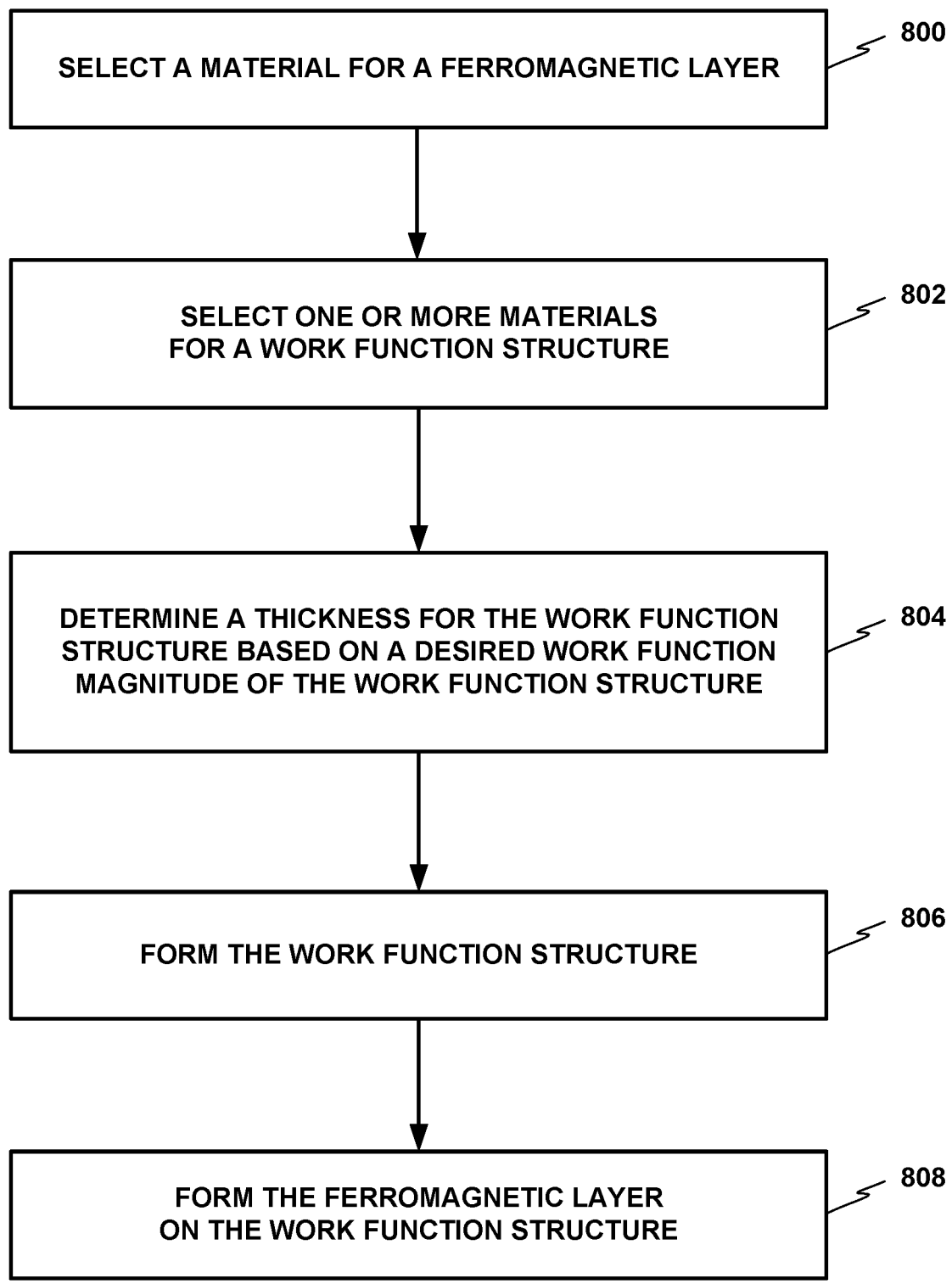
FIG. 8 is a flowchart illustrating example techniques for designing and manufacturing a magnetic device, in accordance with the techniques of this disclosure.

FIG. 8 is a flowchart illustrating example techniques for designing and manufacturing a magnetic device, in accordance with the techniques of this disclosure. The example techniques of FIG. 8 are described with respect to magnetic device 200 shown in FIG. 2, although other components and devices such as magnetic devices 100, 300, and 400 and layer stack 502 shown in FIGS. 1, 3, 4, 5A, and 5B may perform similar techniques.

In the example of FIG. 8, a designer, manufacturer, and/or fabricator selects a material for ferromagnetic layer 220 (800). One or more of the following materials may be used for ferromagnetic layer 220: a CoFeB alloy, such as $Co_{20}Fe_{60}B_{20}$; a CoFe alloy, Co, Fe, FePd, a Co-based Heusler alloy, or a Mn-based alloy, Mn—Ga, Mn—Ge, Mn—Ge—N, a Fe—Pd alloy, ferromagnetic insulator (e.g., $Tm_3Fe_5O_{12}$, $Tb_3Fe_5O_{12}$). The designer, manufacturer, and/or fabricator selects one or more materials for work function structure 230 (802). The selection of materials for work function structure 230 may include the selection of materials for each of layers 232, 234, and 236. The materials of work function structure 230 may be selected to achieve a desired work function magnitude. In addition, one or more of the materials of work function structure 230 may be selected to operate as a spin generating material for a spin-orbit torque channel.

The selection of material(s) may be for a single layer, a bi-layer, a tri-layer, or a multilayer of work function structure 230. First, a material may be selected as a spin-orbit-torque channel, and second, another material may be selected to tune the work function magnitude of work function structure 230. For example, a material that makes a good spin channel may not have the desired work function magnitude, so a second material may allow for tuning of the overall work function magnitude of work function structure 230.

In the example of FIG. 8, the designer, manufacturer, and/or fabricator then determines a thickness for work function structure 230 based on a desired work function magnitude of the work function structure (804). The work function magnitude of work function structure 230 is based on the thicknesses and work function magnitudes of each of layers 232, 234, and 236. In examples in which work function structure 230 includes a Ta—Pd—Ta sandwich structure, increasing the thickness of layer 234 relative to the thicknesses of layers 232 and 236 will increase the work function magnitude of work function structure 230, and decreasing the thickness of layer 234 relative to the thicknesses of layers 232 and 236 will decrease the work function magnitude of work function structure 230.

In the example of FIG. 8, the designer, manufacturer, and/or fabricator forms work function structure 230 (806). In some examples, work function structure 230 is formed on a substrate using, for example, magnetron sputtering and/or epitaxial growth or other growth methods. Work function structure 230 can be formed by forming tantalum layer 236, forming palladium layer 234 on tantalum layer 236, and forming tantalum layer 232 on palladium layer 234. Layers 232, 234, and 236 can be formed at thicknesses that are selected to achieve a desired work function magnitude. The designer, manufacturer, and/or fabricator then forms ferromagnetic layer 220 on work function structure 230 (808). Additionally, dielectric layer 210 can be formed (e.g., by sputtering) on ferromagnetic layer 220, and ferromagnetic layer 250 can be formed on dielectric layer 210. Sputtering, chemical vapor deposition (CVD), plasma enhanced CVD, molecular beam epitaxy, atomic layer deposition, or evaporation deposition may be used in the formation of the layers of device 200.

Figure 9:
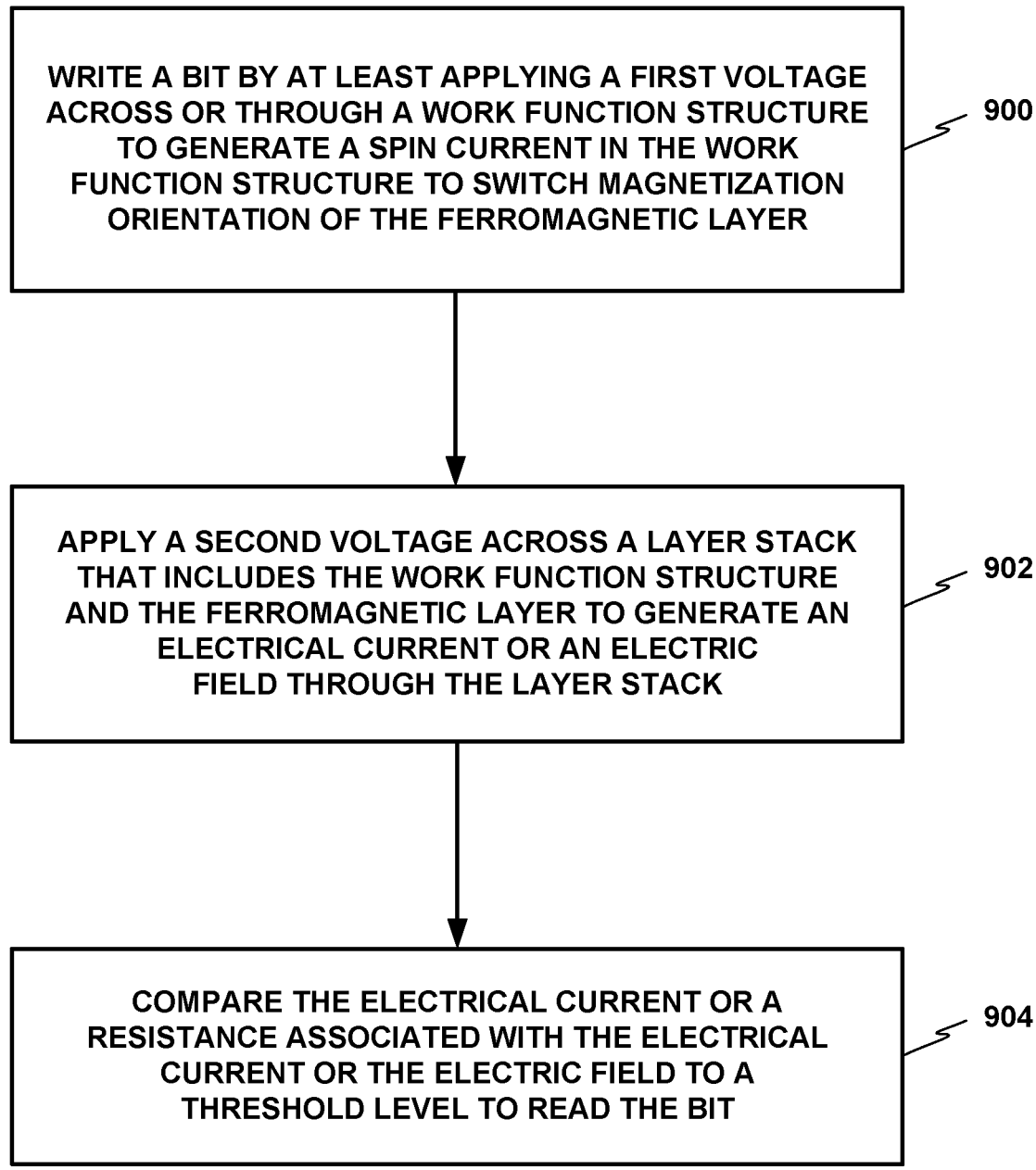
FIGS. 9 and 10 are flowcharts illustrating example techniques for operating a spin memory device (e.g., a magnetic device), in accordance with the techniques of this disclosure.
Figure 10:
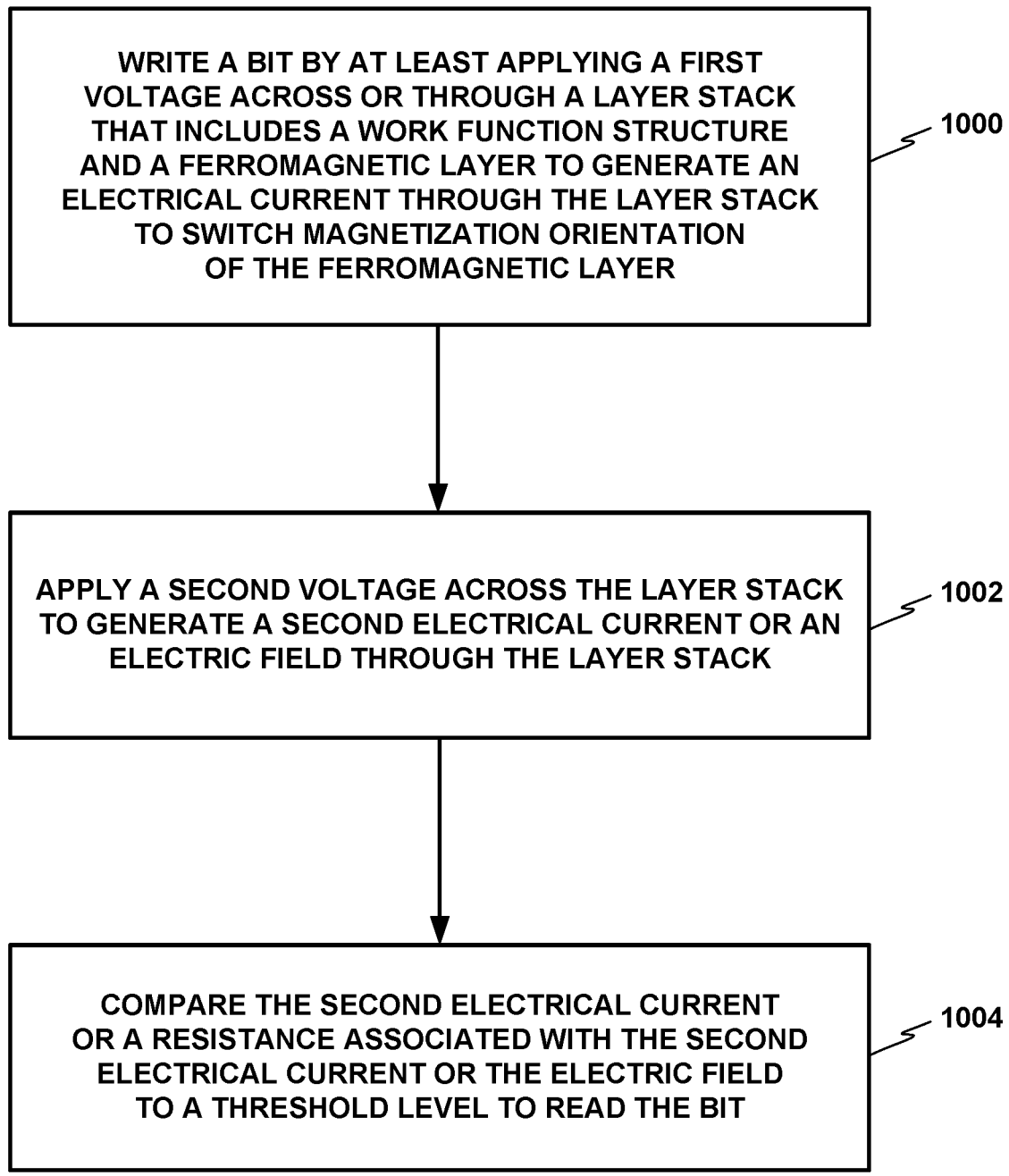

FIGS. 9 and 10 are flowcharts illustrating example techniques for operating a spin memory device (e.g., a magnetic device), in accordance with the techniques of this disclosure. The example techniques of FIGS. 9 and 10 are described with respect to controller 480 and magnetic device 400 shown in FIG. 4, although other components and devices such as magnetic devices 100, 200, 300, and 400B and controllers 180 and 480B shown in FIGS. 1-4B may perform similar techniques.

In the example of FIG. 9, controller 480A writes a bit to magnetic device 400A by at least applying a first voltage across work function structure 430A to generate a spin current in work function structure 430A to switch the magnetization orientation of ferromagnetic layer 420A (900). For example, controller 480A may control current source 460 to apply the first voltage across terminals 442A and 444A to cause a current to flow between terminals 442A and 444A through work function structure 430A. The current flowing through work function structure 430A may cause the magnetization state of ferromagnetic layer 420A to switch because of the spin-orbit torque generated in work function structure 430A. Spin-orbit torque switching with a work function structure can be used even with a unipolar VCMA effect caused by a two-nanometer inner layer of palladium, platinum, or another material. Unipolar operation may be useful where the electron depletion of ferromagnetic layer 420B is insufficient to achieve bipolar operation.

In the example of FIG. 9, controller 480A reads the bit value by applying a second voltage across layer stack 402 (902). Controller 480A can apply the second voltage by controlling voltage source 462 to create the second voltage across electrodes 455A and 444A. A thresholding circuit compares the electrical current through work function structure 430A or an associated resistance to a threshold level to read the bit (904). The thresholding circuit may include software instructions executed by controller 480A, digital circuitry (e.g., a comparator), and/or analog circuitry for comparing the electrical current (or an indication thereof) or a resistance value associated with the electrical current to a threshold level, where the resistance value is associated with the electrical current through Ohm's Law.

In the example of FIG. 10, controller 480A writes a bit to magnetic device 400A by at least applying a first voltage across layer stack 402 to generate a spin current (e.g., for a metallic work function structure) or an electric field (e.g., for a semiconducting or insulating work function structure) through ferromagnetic layers 420A and 450A, dielectric layer 410A, and work function structure 430A to switch the magnetization orientation of ferromagnetic layer 420A (1000). The current flowing through layer stack 402 or the electric field on layers 420A and 430A can cause the magnetization state of ferromagnetic layer 420A to switch because of the spin-transfer torque generated in work function structure 430A. The applied voltage may temporarily lower the magnetic anisotropy energy, which allows for a reduced switching current or a reduced switching electric field. After the magnetization state of ferromagnetic layer 420A is switched, the magnetic anisotropy energy returns to a larger magnitude, which promotes thermal stability.

In the example of FIG. 10, controller 480A reads the bit value by applying a second voltage across layer stack 402 (1002). A thresholding circuit compares the electrical through work function structure 430 or an associated resistance to a threshold level to read the bit (1004). Additional example details of reading and writing data to magnetic tunnel junction are described in commonly assigned U.S. patent application Ser. No. 17/078,764, entitled "Topological Material for Trapping Charge and Switching a Ferromagnet," filed on Oct. 23, 2020, the entire contents of which are incorporated herein by reference.

Various examples have been described. These and other examples are within the scope of the following claims.

The invention claimed is:

1. A magnetic device comprising a layer stack comprising:
a work function structure;
a dielectric layer; and
a ferromagnetic layer positioned between the work function structure and the dielectric layer,
wherein a magnetization orientation of the ferromagnetic layer is configured to be switched by a first voltage applied across the layer stack or by a second voltage across or through the work function structure, and
wherein the work function structure is configured to deplete electrons from the ferromagnetic layer or accumulate electrons in the ferromagnetic layer in response to application of at least one of the first voltage or the second voltage.

2. The magnetic device of claim 1, wherein the work function structure comprises tantalum, palladium, or platinum.

3. The magnetic device of claim 1,
wherein the work function structure comprises an alloy including a first element and a second element, and
wherein the work function structure is deposited as at least one layer of the first element and at least one layer of the second element.

4. The magnetic device of claim 1,
wherein the work function structure comprises a sandwich structure including a first outer layer of a first material, a second outer layer of the first material, and an inner layer of a second material, and
wherein the inner layer is positioned between the first and second outer layers.

5. The magnetic device of claim 4,
wherein the first material comprises tantalum, and
wherein the second material comprises palladium or platinum.

6. The magnetic device of claim 4,
wherein a thickness of the first outer layer is greater than zero and less than about five nanometers, and
wherein a thickness of the second outer layer is greater than zero and less than about five nanometers.

7. The magnetic device of claim 4 wherein a thickness of the first outer layer is greater than zero and less than about two nanometers.

8. The magnetic device of claim 4, wherein a thickness of the inner layer is greater than zero and less than about one nanometer.

9. The magnetic device of claim 1, wherein a thickness of the work function structure is between about one nanometer and about ten nanometers.

10. The magnetic device of claim 1, further comprising a controller configured to:
apply the second voltage across or through the work function structure to configure the work function structure to deplete electrons from the ferromagnetic layer or accumulate electrons in the ferromagnetic layer and further generate a spin current in the work function structure,
wherein the spin current is configured to switch the magnetization orientation of the ferromagnetic layer.

11. The magnetic device of claim 10, further comprising:
a first terminal coupled to the work function structure;
a second terminal coupled to the work function structure; and
a third terminal positioned on a surface of the dielectric layer opposite from the ferromagnetic layer,
wherein the controller is configured to apply the second voltage across the first and second terminals to switch the magnetization orientation of the ferromagnetic layer.

12. The magnetic device of claim 1, further comprising a controller configured to:
apply the first voltage across the layer stack to generate an electric field through the layer stack,
wherein the electric field or an associated electrical current is configured to switch the magnetization orientation of the ferromagnetic layer.

13. The magnetic device of claim 12, further comprising:
a first terminal coupled to the work function structure; and
a second terminal positioned on a surface of the dielectric layer opposite from the ferromagnetic layer,
wherein the controller is configured to apply the first voltage across the first and second terminals to switch the magnetization orientation of the ferromagnetic layer.

14. The magnetic device of claim 1, further comprising a voltage controlled magnetic anisotropy magnetoresistive random access memory device,
wherein the voltage controlled magnetic anisotropy magnetoresistive random access memory device comprises the work function structure, the dielectric layer, and the ferromagnetic layer.

15. The magnetic device of claim 1, further comprising a stochastic computing device,
wherein the stochastic computing device comprises a random bit stream generator, and
wherein the random bit stream generator comprises the work function structure, the dielectric layer, and the ferromagnetic layer.

16. The magnetic device of claim 1, further comprising a stochastic spiking neural network device,
wherein the stochastic spiking neural network device comprises the work function structure, the dielectric layer, and the ferromagnetic layer.

17. A method comprising:
selecting a material for a ferromagnetic layer;
selecting a first material for two outer layers of a work function structure to achieve a desired work function magnitude and to operate as a spin-orbit-torque channel, wherein the work function structure is configured to deplete electrons from the ferromagnetic layer or accumulate electrons on the ferromagnetic layer in response to a voltage across or through the work function structure;
selecting a second material for an inner layer of the work function structure;
determining a thickness for the work function structure based on the desired work function magnitude of the work function structure;
causing forming the work function structure; and
causing forming the ferromagnetic layer on the work function structure.

18. The method of claim 17, further comprising determining the desired work function magnitude of the work function structure based on a work function magnitude of the material for the ferromagnetic layer.

19. A method for storing a bit in a spin memory device comprising a layer stack comprising a work function structure, a dielectric layer, and a ferromagnetic layer positioned between the work function structure and the dielectric layer, the method comprising:
writing the bit by at least applying a first voltage across or through the work function structure to generate a spin current in the work function structure, wherein the spin current is configured to switch the magnetization orientation of the ferromagnetic layer;
reading the bit by at least:
applying a second voltage across the layer stack to generate a spin current or an electric field through the layer stack; and
comparing the electrical current or a resistance associated with the electrical current to a threshold level,
wherein the work function structure is configured to deplete electrons from the ferromagnetic layer or accumulate electrons in the ferromagnetic layer in response to application of at least one of the first voltage or the second voltage.

20. The method of claim 19,
wherein writing the bit comprises generating the spin current through a sandwich structure of the work function structure,
wherein the sandwich structure comprises a first outer layer, a second outer layer, and an inner layer positioned between the first and second outer layers,
wherein the first outer layer as deposited comprises tantalum,
wherein the second outer layer as deposited comprises tantalum, and
wherein the inner layer as deposited comprises palladium.

* * * * *